United States Patent
Arknæs-Pedersen et al.

(10) Patent No.: US 8,242,941 B2
(45) Date of Patent: Aug. 14, 2012

(54) PULSE MODULATION A/D-CONVERTER WITH FEEDBACK

(75) Inventors: Lars Arknæs-Pedersen, Viby J (DK); Kim Rishoj Pedersen, Ega (DK)

(73) Assignee: The TC Group A/S (DK)

( * ) Notice: Subject to any disclaimer, the term of this patent is extended or adjusted under 35 U.S.C. 154(b) by 195 days.

(21) Appl. No.: 12/743,960

(22) PCT Filed: Nov. 19, 2008

(86) PCT No.: PCT/DK2008/050275
§ 371 (c)(1), (2), (4) Date: May 20, 2010

(87) PCT Pub. No.: WO2009/065412
PCT Pub. Date: May 28, 2009

(65) Prior Publication Data
US 2010/0245139 A1 Sep. 30, 2010

Related U.S. Application Data

(60) Provisional application No. 60/989,260, filed on Nov. 20, 2007.

(30) Foreign Application Priority Data

Nov. 20, 2007 (DK) ................................ 2007 01645
Nov. 20, 2007 (DK) ................................ 2007 01646

(51) Int. Cl.
*H03M 1/06* (2006.01)
(52) U.S. Cl. .................. 341/118; 341/143; 341/155
(58) Field of Classification Search .................. 341/118, 341/143
See application file for complete search history.

(56) References Cited

U.S. PATENT DOCUMENTS

| 4,789,862 A * | 12/1988 | Jackson .................. 341/155 |
| 4,947,141 A | 8/1990 | Atkinson |
| 4,947,171 A * | 8/1990 | Pfeifer et al. ............. 341/143 |
| 6,426,714 B1 | 7/2002 | Ruha |
| 6,642,873 B1 | 11/2003 | Kuang |
| 7,183,957 B1 | 2/2007 | Melanson |

(Continued)

FOREIGN PATENT DOCUMENTS

EP 0339921 A2 11/1989

(Continued)

OTHER PUBLICATIONS

International Search Report PCT/DK2008/050275; Dated Mar. 31, 2010.

*Primary Examiner* — Khai M Nguyen
(74) *Attorney, Agent, or Firm* — Cantor Colburn LLP

(57) ABSTRACT

The invention relates to an A/D converter comprising an input and an output, a D/A converting feedback and a pulse width modulating forward path, the D/A converting feedback comprising at least one feed-back path, the feed-back path establishing a D/A conversion based on at least two D/A conversions subject to uncorrelated errors.

Figure 1:
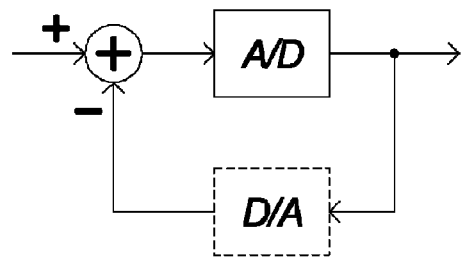

The invention further relates to a jitter consequence reducing D/A-converter comprising a jitter-robust intermediate signal established on the basis of a digital input signal.

The invention further relates to a method for jitter consequence reduction in a pulse width modulated A/D-converter feedback, comprising establishing at least two D/A-conversions subject to uncorrelated errors, and combining, preferably by summing, said at least two D/A-conversions.

31 Claims, 17 Drawing Sheets

U.S. PATENT DOCUMENTS

| | | |
|---|---|---|
| 2001/0006371 A1 | 7/2001 | Bolz |
| 2005/0073453 A1 | 4/2005 | Cheng |

FOREIGN PATENT DOCUMENTS

| | | |
|---|---|---|
| JP | 2006333053 | 12/2006 |
| WO | 9944289 A1 | 9/1999 |
| WO | 0019615 A2 | 4/2000 |
| WO | 0223733 A2 | 3/2002 |
| WO | 2005029707 A1 | 3/2005 |
| WO | 2005029708 A1 | 3/2005 |

\* cited by examiner

PULSE MODULATION A/D-CONVERTER WITH FEEDBACK

FIELD OF THE INVENTION

The present invention relates to jitter consequence reduction in A/D-converters, in particular PWM A/D-converters with feedback.

BACKGROUND OF THE INVENTION

Converters for establishing a digital representation of an analog signal, i.e. A/D-converters, are well-known in the art. Several types of A/D-converters exist, and among these, the class of time quantization converters or pulse modulation converters, e.g. PWM modulating A/D-converters and delta-sigma A/D-converters has proven very advantageous. This is among other things because up-to-date technology enabling very fast processing facilitates more accurate precision in time than in amplitude.

A problem with time quantization converters is quantization errors introduced by the sampler or quantizer whenever the actual edge of a pulse does not happen to coincide with a clock edge. Improved time quantization A/D-converters therefore comprise a feedback around the sampler or quantizer for suppressing the quantization error. Examples of PWM A/D-converters are described in the applicant's PCT patent applications WO 2005/029707 A1 and WO 2005/029708 A1, hereby incorporated by reference in their entirety.

Also the feedback time quantization A/D-converters suffer, however, from a problem, namely that the D/A-conversion or corresponding action required to feedback the digital output to compare with the analog input introduces time jitter errors in the feedback path. This time jitter may e.g. derive from the clock controlling the feedback path D/A-converter. And because the errors are introduced in the feedback path itself, they are not suppressed by the loop, and directly affect the performance of the A/D-converter.

An object of the present invention is to obtain a time quantizing A/D-converter with feedback, which features attenuation of errors, in particular jitter, introduced in the feedback path.

SUMMARY OF THE INVENTION

The present invention relates to an A/D converter comprising an input and an output, a D/A converting feedback and a pulse width modulating forward path, the D/A converting feedback comprising at least one feed-back path, the feed-back path establishing a D/A conversion based on at least two D/A conversions subject to uncorrelated errors.

According to the present invention an advantageous improvement in A/D-converters is provided by presenting a feedback path which is far less sensitive to the consequence of jitter errors in the clock. When a feedback path is required in an A/D converter, it has to perform a D/A-conversion. Because of weak D/A-converters, i.e. converters that are very sensitive to jitter errors, the analog feedback signal, which should resemble the digital output of the A/D-converter, often comprises a lot of errors from the D/A-converter. By the present invention the consequence of jitter errors can be reduced significantly, and thereby make the feedback signal much more robust against jitter errors in the D/A-converter(s). One of the main features in this regard is the multiple D/A-conversions, which are each subject to uncorrelated errors. In other words, the digital signal is converted into an analog representation at several instances, and each time with an error that is uncorrelated with the error used in the other instances. According to different embodiments described below, the multiple D/A-conversions may be carried out sequentially or in parallel by different latches, or by one or more monostable multivibrator, or by any other means which provide for uncorrelated jitter errors used for the corresponding conversions.

The number of error sources and associated partial conversions may determine the effective error suppression.

When said errors are jitter errors, an advantageous embodiment of the present invention is obtained.

When said errors are derived from one or more error sources, preferably comprising clock signals, an advantageous embodiment of the present invention is obtained.

When the at least two D/A conversions are summed, an advantageous embodiment of the present invention is obtained.

The at least two partial D/A conversions are preferably averaged, which may include amplification where the uncorrelated errors contributes substantially equal to the resulting D/A converted signal in the feed-back path.

In the present context uncorrelated means that the averaging results in a reduction of the resulting error in the feed-back path. Thus, a number of completely uncorrelated error signal, e.g. jitter containing clocks, will establish a strongly reduced influence if they are applied according to the provisions of the invention.

When the uncorrelated errors are established on the basis of one or more error source, an advantageous embodiment of the present invention is obtained.

In a preferred embodiment of the present invention, a common error source, e.g. a common clock, is used to establish the uncorrelated errors. This is possible because the jitter errors or each edge in a clock signal are typically uncorrelated with each other, and distributed according to a Gaussian distribution. Hence, by using different clock edges from a common clock to perform the multiple D/A-conversions of the same instance of the digital signal, actually several D/A-conversions are performed subject to uncorrelated errors.

When the D/A converting feedback comprises a multiple of serially-coupled latches, an advantageous embodiment of the present invention is obtained.

According to a preferred embodiment of the present invention, the multiple D/A-conversions with different clock edges are implemented by using several serially-coupled latches, driven by the common clock.

When the uncorrelated errors are established on the basis of a number of parallel error sources, an advantageous embodiment of the present invention is obtained.

In an alternative embodiment of the invention, several error sources, e.g. clock signals, with uncorrelated errors, are provided.

When the D/A converting feedback comprises a multiple of latches coupled in parallel, i.e. having same input, an advantageous embodiment of the present invention is obtained.

When the D/A converting feedback comprises a multi-level D/A-converter, preferably a binary weighed multi-level D/A-converter, an advantageous embodiment of the present invention is obtained.

According to a preferred embodiment of the present invention, the multiple D/A-conversions with uncorrelated errors can be obtained by using a multi-level D/A-converter on a smoothed or low-pass filtered version of the digital signal.

When the uncorrelated errors are derived from substantially Gaussian jitter in a clock signal, an advantageous embodiment of the present invention is obtained.

When the uncorrelated errors are established on the basis of one or more error source by means of multiple outputs from a delay line, an advantageous embodiment of the present invention is obtained.

This means that the error signal of the individual source must be uncorrelated over time.

When the D/A converting feedback comprises at least one monostable multivibrator or equivalent which converts a digital bitstream into an analog sum-of-bits, an advantageous embodiment of the present invention is obtained.

According to an embodiment of the present invention, one or more monostable multivibrators are used to convert the consequence of jitter errors from a width-error to a time-error. This translates in the analog domain to conversion from an amplitude-error to a time-error, which is less significant. The monostable multivibrator embodiments work by performing several sequential or overlapping D/A-conversions, whereby is formed a multiple of analog pulses instead of a single pulse. This means, that the number of pulses becomes significant instead of the width of the individual pulses.

When said D/A converting feedback path comprises oversampling means, an advantageous embodiment of the present invention is obtained.

The D/A-converting feedback should preferably work at a higher frequency than the A/D-converter's forward path, at least when sequential, partial D/A-conversions are applied.

When said A/D-converter comprises a downsampler or decimator, an advantageous embodiment of the present invention is obtained.

When said pulse width modulating forward path is self-oscillating, an advantageous embodiment of the present invention is obtained.

When said A/D converter establishes a 3-level PWM signal, an advantageous embodiment of the present invention is obtained.

When said A/D converter comprises a multi channel A/D converter, an advantageous embodiment of the present invention is obtained.

The present invention further relates to a jitter consequence reducing D/A-converter comprising a jitter-robust intermediate signal established on the basis of a digital input signal.

In broad terms, the jitter consequence reducing D/A-converter works by conditioning the signal into a signal which jitter errors affect less, without removing utility information. Such conditioning typically comprises a kind of low-pass filtering or high frequency component reduction.

In other words, the consequence of the jitter in the resulting analog signal is a combination of the amount of jitter in the clock or errors in other conversion means and how much the signal is affected by jitter or errors. Thus the jitter consequence can be reduced by either decreasing the jitter or increasing the signal's robustness to jitter.

Several of the jitter consequence reducing D/A-converter embodiments according to the present invention can also be described as establishing the full analog signal as the sum of several partly D/A-conversions, where the term partly relates to the amplitude. I.e. instead of converting one or a few steps, the signal is transformed into a multi-level signal, and each step is converted separately or at least with jitter or other errors uncorrelated with the other conversions. The effect of such embodiments depend on the number of conversions: An increasing count of correlated signal+uncorrelated noise source contributions will turn into an increasing signal to noise ratio.

When said jitter consequence reducing D/A-converter comprises a filter and a multi-level D/A-converter, an advantageous embodiment of the present invention is obtained.

When the multi-level D/A-converter comprises a binary-weighed multi-level D/A-converter, an advantageous embodiment of the present invention is obtained.

When the jitter-robust intermediate signal comprises a number of effective signal levels greater than the number of effective signal levels in the digital input signal, an advantageous embodiment of the present invention is obtained.

According to the present invention, the term effective levels refer to a decoded version of a signal. Hence a 2-level PWM signal comprises 2 effective levels, a 16 level PCM signal comprises 16 effective levels, but a 4-bit binary encoded PCM signal also comprises 16 effective levels.

When the establishment of said jitter-robust intermediate signal comprises reducing, filtering, shaping or conditioning high frequency content of the digital input signal, an advantageous embodiment of the present invention is obtained.

When conversions for each level in the multi-level D/A-converter are subject to errors, preferably jitter errors, and the errors for each level are uncorrelated and derived from one or more error sources, an advantageous embodiment of the present invention is obtained.

When the filter comprises a high-frequency reducing, filtering, shaping or conditioning filter, an advantageous embodiment of the present invention is obtained.

When said jitter consequence reducing D/A-converter comprises a multi-channel D/A-converter, an advantageous embodiment of the present invention is obtained.

When said jitter consequence reducing D/A-converter comprises multiple jitter-robust, intermediate signals, filters and multi-level D/A-converters, together forming a multi-level jitter consequence reducing D/A-converter, an advantageous embodiment of the present invention is obtained.

When said jitter consequence reducing D/A-converter comprises at least one monostable multivibrator or equivalent adapted to convert a digital bitstream into an analog sum-of-bits-signal, an advantageous embodiment of the present invention is obtained.

The present invention further relates to a pulse modulated A/D-converter comprising feedback, wherein the feedback comprises a jitter consequence reducing D/A-converter according to any of the above.

When said pulse modulated A/D-converter comprises an A/D-converter according to any of the above, an advantageous embodiment of the present invention is obtained.

The present invention further relates to a method for jitter consequence reduction in a pulse width modulated A/D-converter feedback, comprising establishing at least two D/A-conversions subject to uncorrelated errors, and combining, preferably by summing, said at least two D/A-conversions. In addition to all of the above, the present invention also comprises broader aspects, using the same principles to achieve advantages in other contexts, or to further improve the above-described embodiments.

For example, the jitter consequence reducing D/A-converter may be used with the same or similar advantages in other digital to analog conversion tasks, in particular where a bitstream, e.g. PWM, is converted to an analog representation.

In particular the jitter sensitivity reduced D/A principles may be used for reducing errors in a PWM amplifier by letting the PWM A/D converter provide the A/D conversion of the error signal; i.e. difference between desired PWM output and actual PWM output, for PWM amplifier output error correction purposes.

THE DRAWINGS

Figure 2:
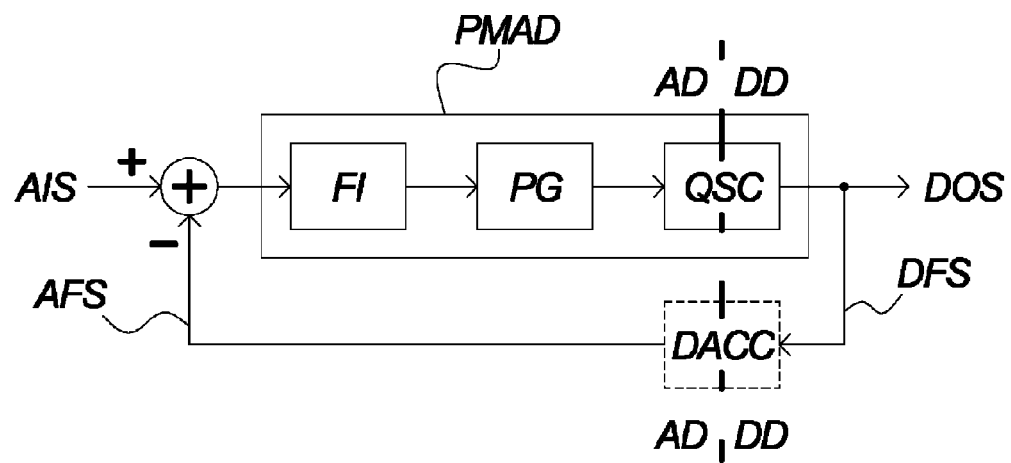
Figure 3:
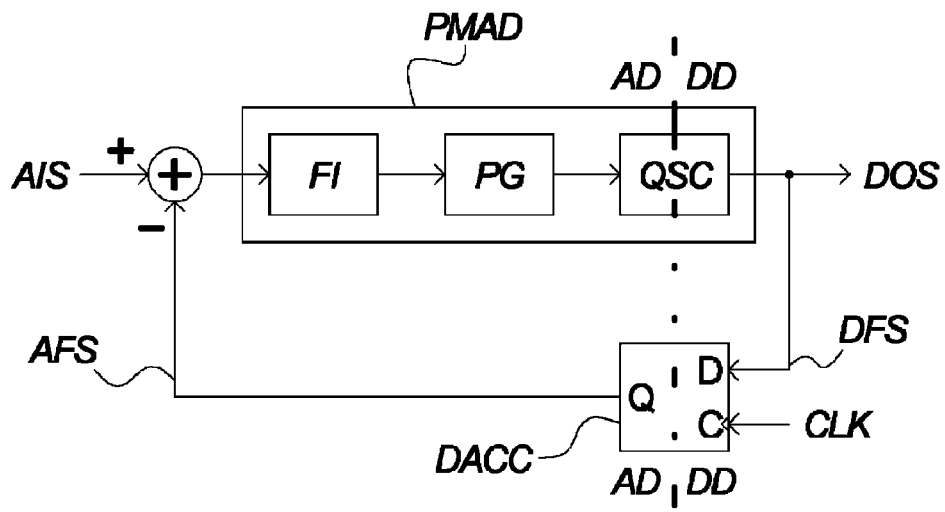
Figure 4:
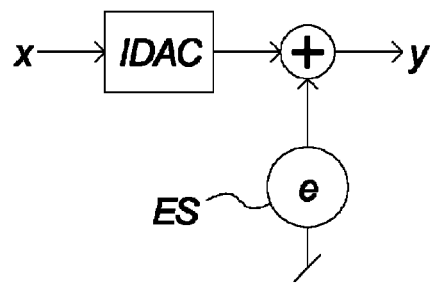
Figure 5:
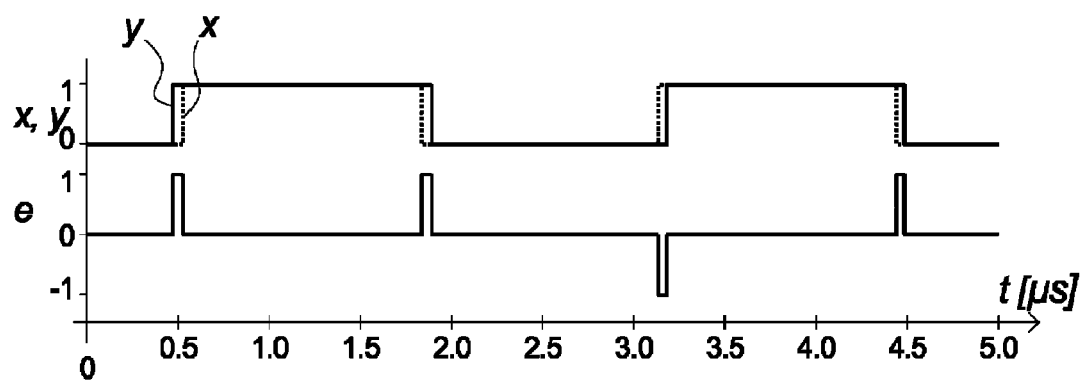
Figure 6:
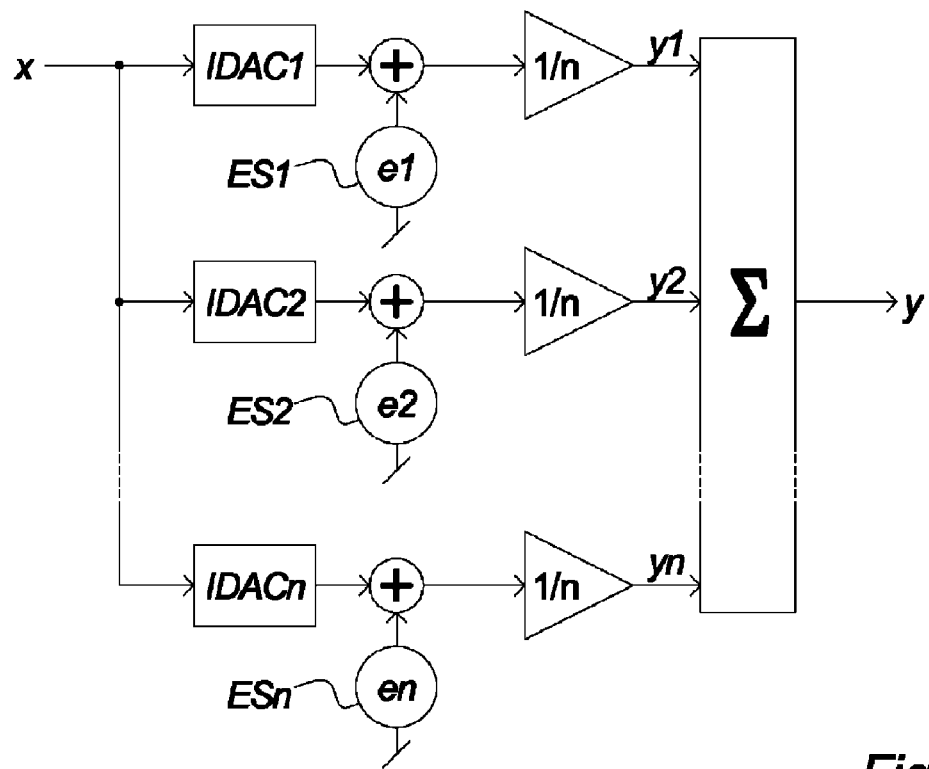
Figure 7:
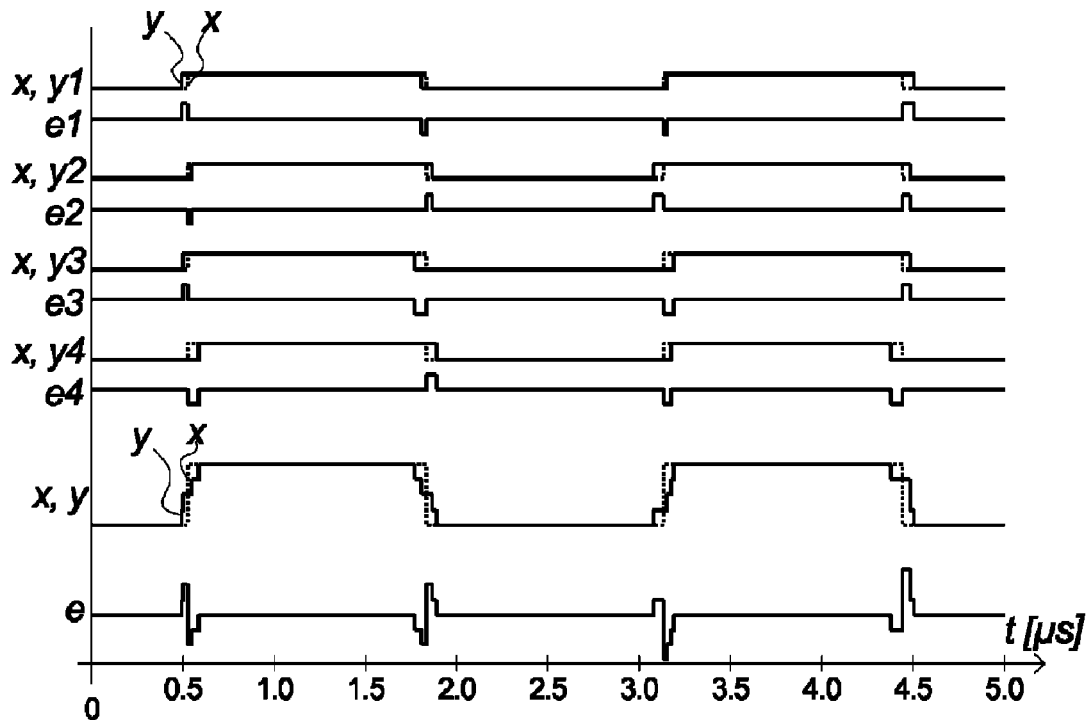
Figure 8:
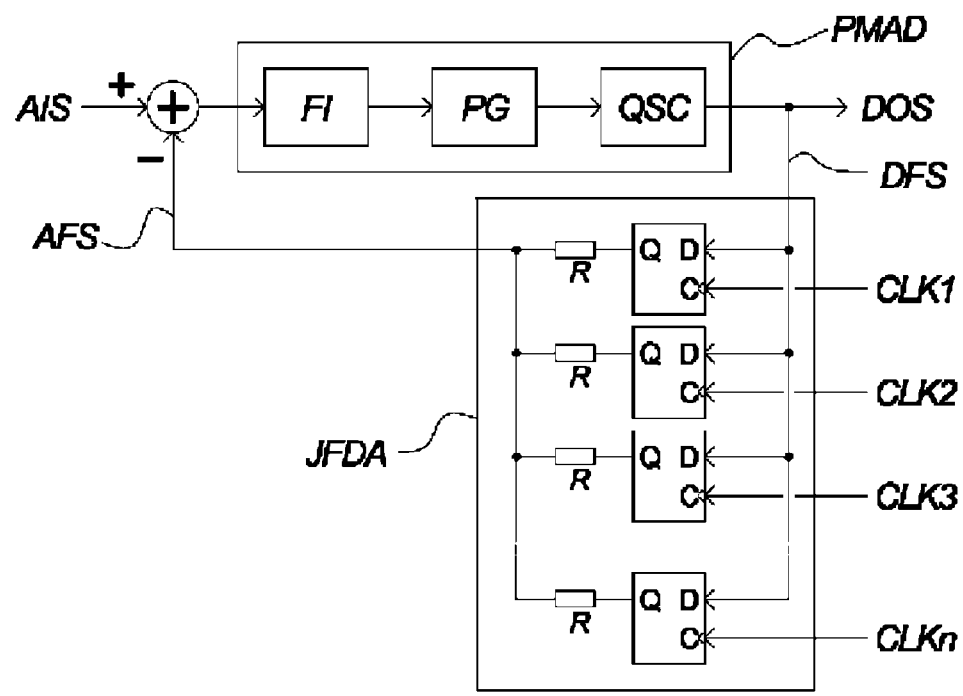
Figure 9:
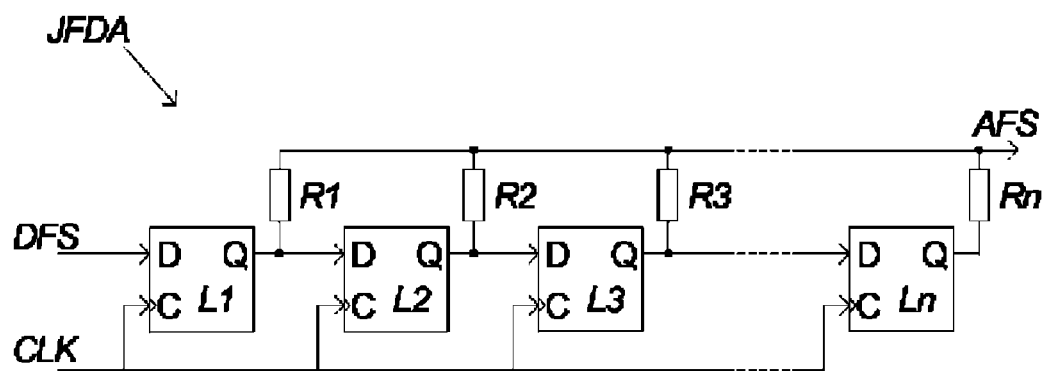
Figure 10:
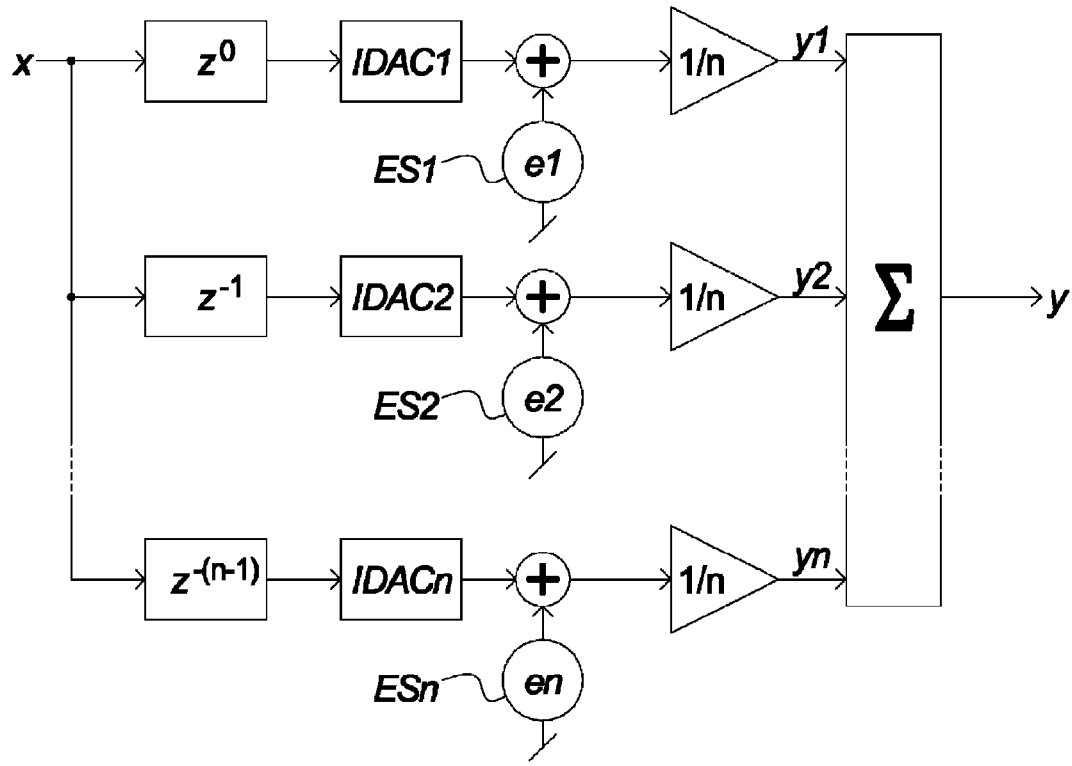
Figure 11:
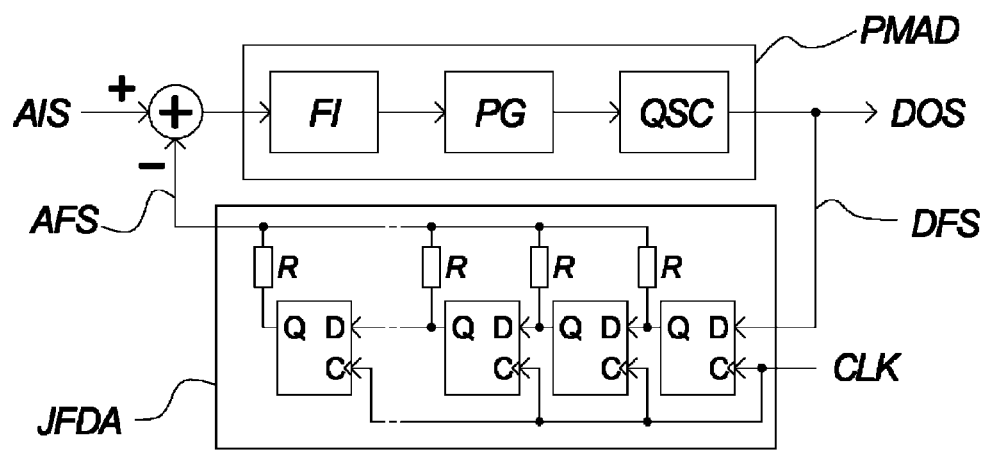
Figure 12:
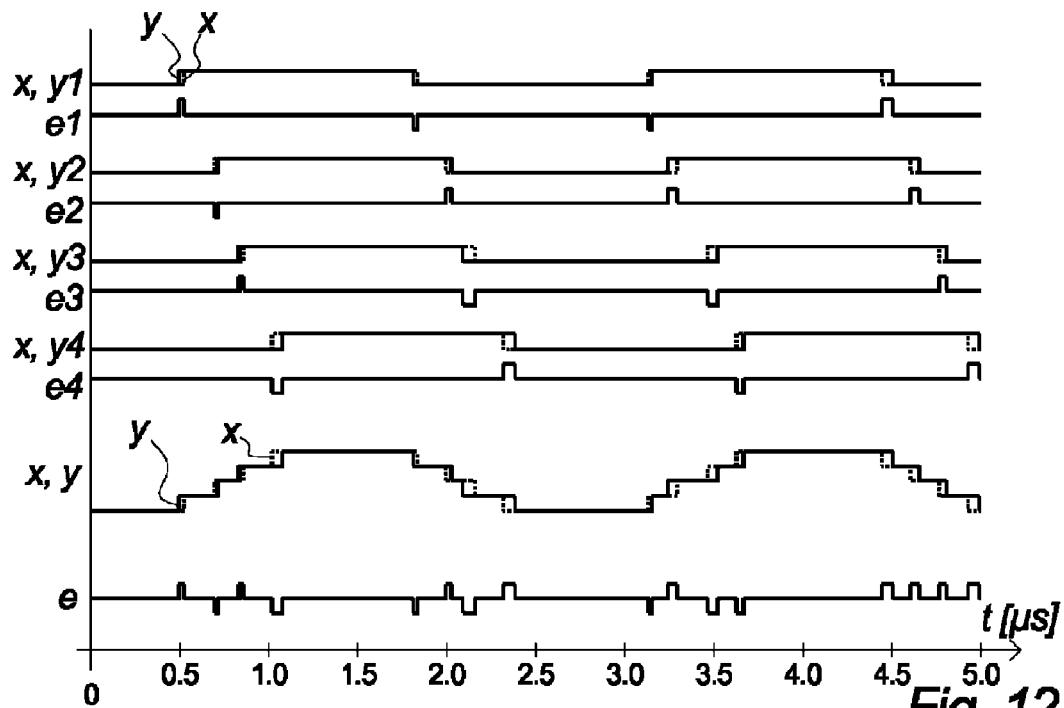
Figure 13:
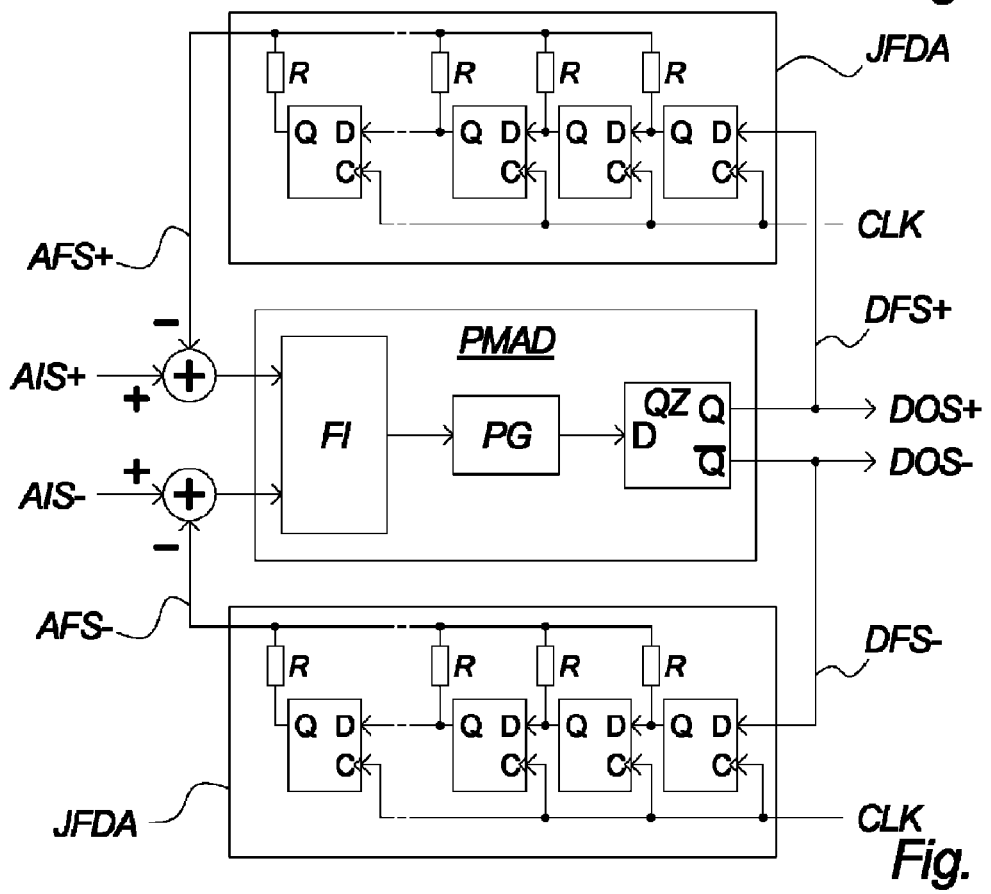
Figure 14:
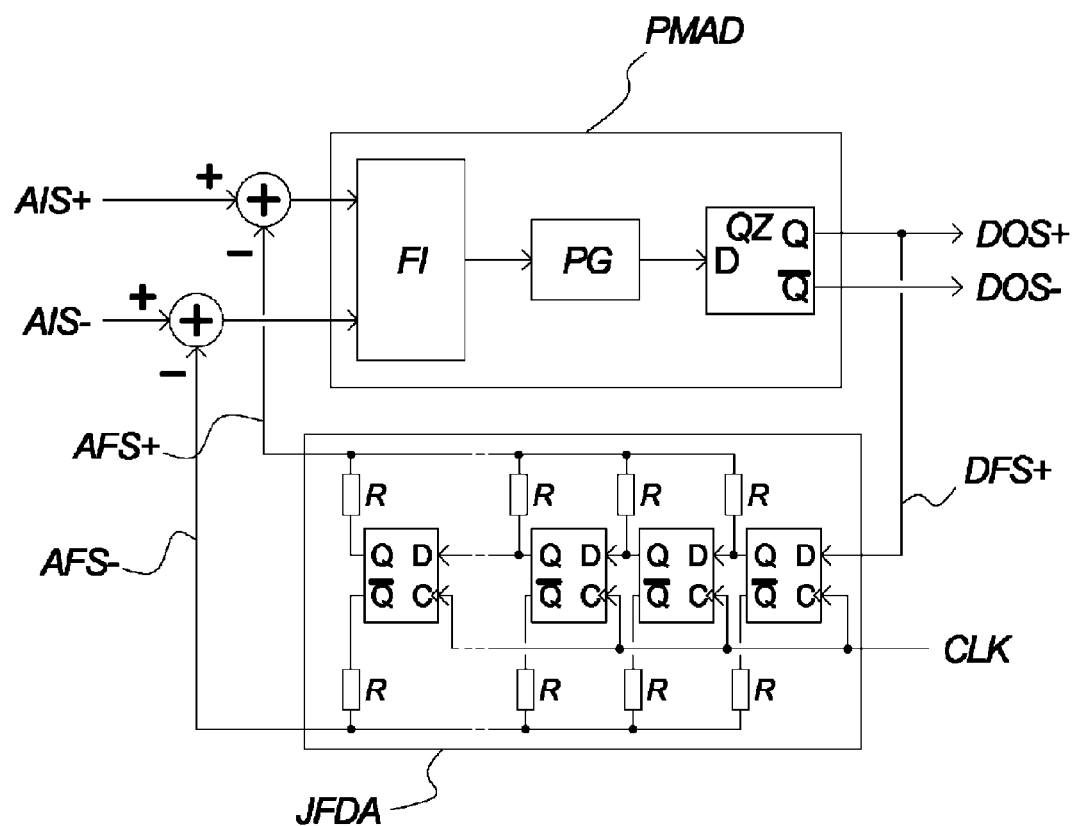
Figure 15:
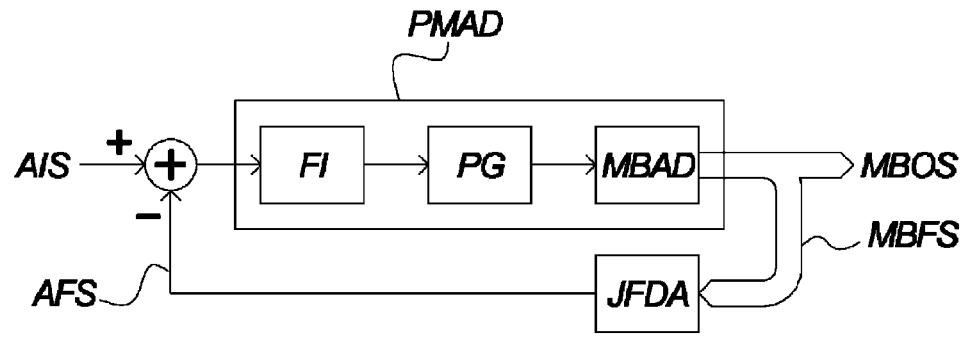
Figure 16:
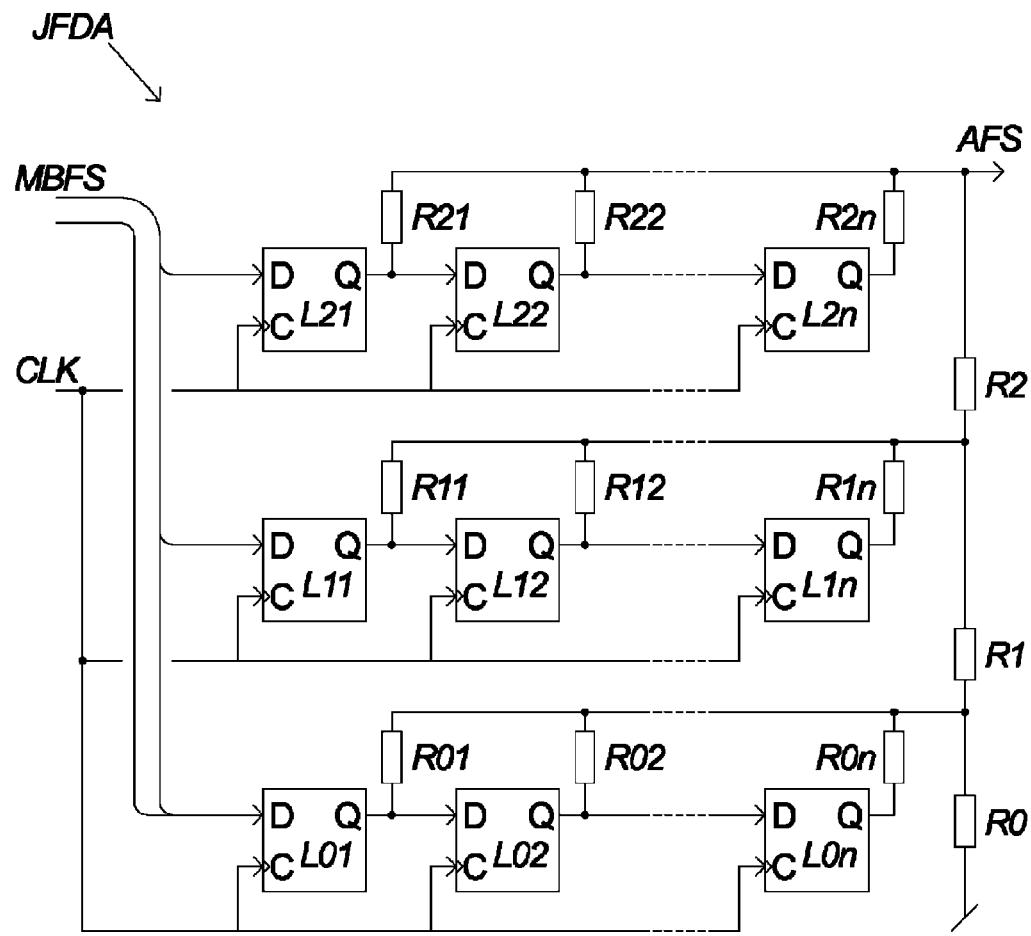
Figure 17:
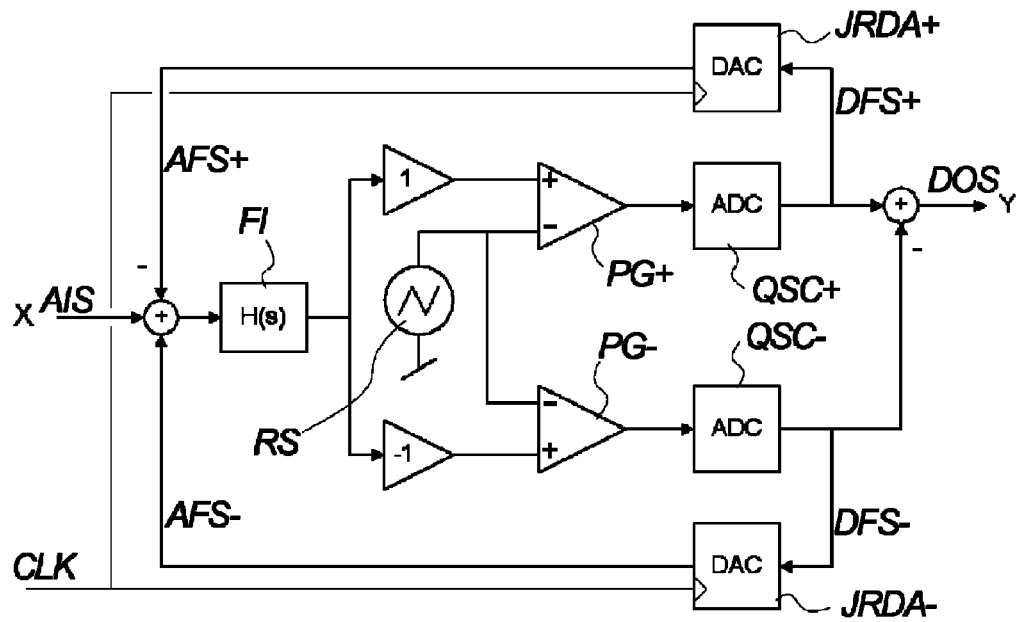
Figure 18:
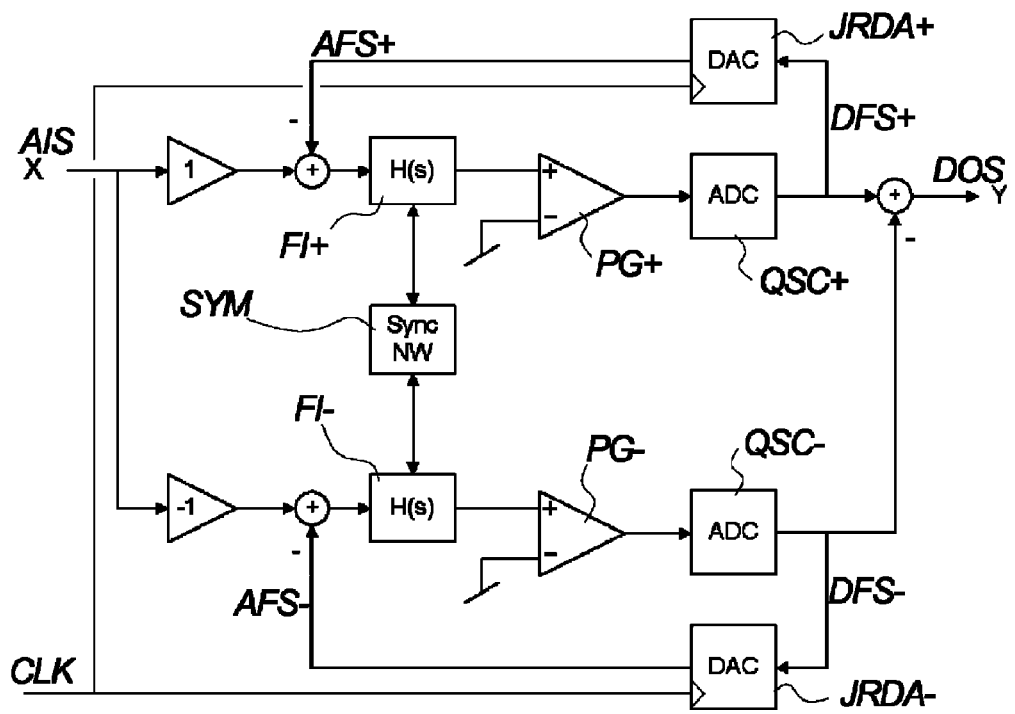
Figure 19:
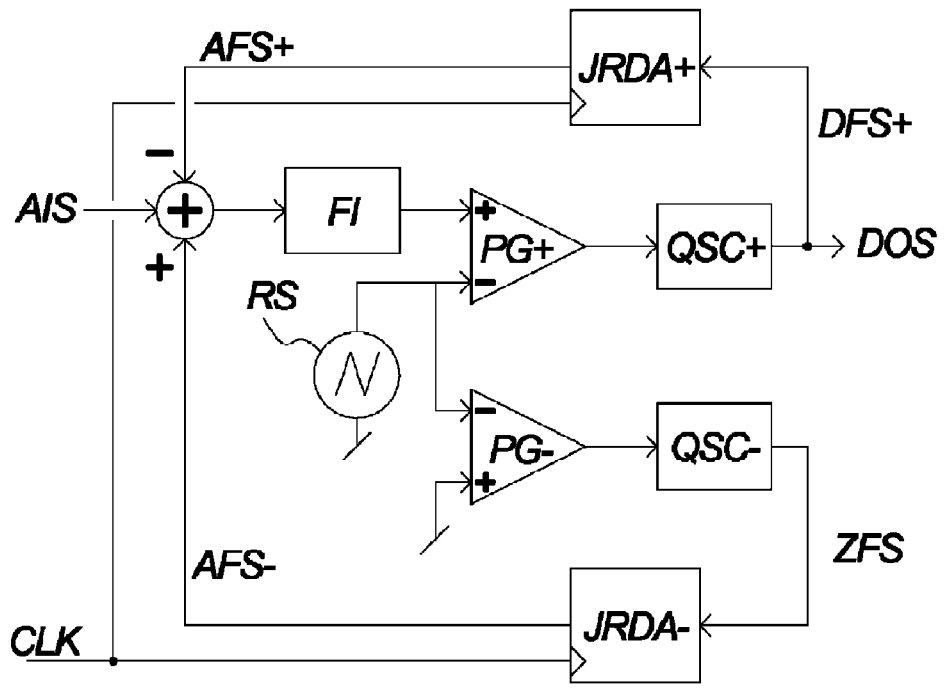

The invention will in the following be described with reference to the drawings where FIG. 1 illustrates an A/D-converter with feedback, FIG. 2 illustrates a pulse modulation A/D-converter with feedback, FIG. 3 illustrates a pulse modulation A/D-converter with feedback conversion, FIG. 4 illustrates a model of the D/A-converter in FIG. 3, FIG. 5 illustrates a timing diagram associated with the model of FIG. 4, FIG. 6 illustrates a model of a D/A-converter in an embodiment of the present invention, FIG. 7 illustrates a timing diagram associated with the model of FIG. 6, FIG. 8 illustrates an embodiment of an A/D-converter according to the present invention, FIG. 9 illustrates a preferred embodiment of a D/A-converter in an embodiment of the present invention, FIG. 10 illustrates a model of the D/A-converter of FIG. 9, FIG. 11 illustrates a preferred embodiment of an A/D-converter according to the present invention, FIG. 12 illustrates a timing diagram associated with the model of FIG. 10, FIG. 13 illustrates an embodiment of a differential A/D-converter according to the present invention, FIG. 14 illustrates an alternative embodiment of a differential A/D-converter according to the present invention, FIG. 15 illustrates an embodiment of a multi-bit A/D-converter according to the present invention, FIG. 16 illustrates an embodiment of a multi-bit D/A-converter for use with the embodiment of FIG. 15, FIG. 17 illustrates an embodiment of a 3-level A/D-converter according to the present invention, FIG. 18 illustrates an embodiment of a self-oscillating 3-level A/D-converter according to the present invention, FIG. 19 illustrates an embodiment of an A/D-converter according to the present invention, FIG. 20-29 illustrates embodiments of jitter consequence reducing D/A-converters according to the present invention, and FIG. 30-35 illustrates embodiments of A/D-converters according to the present invention.

DETAILED DESCRIPTION

FIG. 1 illustrates an A/D-converter with feedback for suppressing errors introduced in the forward path. Such errors typically comprise quantization errors because the digital output of the A/D-converter is by nature discrete, whereas the source signal resembled by the digital output is by nature continuous. Moreover, the clock used by the A/D-converter inherently comprises time errors, i.e. jitter, corresponding to the quality of the clock. By adding a feedback and suitable filtering, the truly forward path errors, but only them, can be effectively suppressed, thereby significantly improving the accuracy by which the discrete output signal corresponds to the continuous input signal. The comparison of a continuous signal, the analog input signal, with a discrete signal, the digital output signal, by the summing point, is however not necessarily straightforward, and may require a signal conversion from digital to analog, e.g. by means of a D/A-converter.

FIG. 2 illustrates an embodiment of a pulse width modulation A/D-converter, i.e. a PWM A/D-converter, with quantization error suppression by feedback. It comprises an analog input signal AIS delivered to a pulse modulation A/D-converter PMAD, which in this embodiment comprises a filter FI, a pulse generator PG and a time quantization and/or sampling circuit QSC. The output of the pulse modulation A/D-converter PMAD is a digital output signal DOS. The feedback path comprises a digital feedback signal DFS derived from the digital output signal DOS and converted into an analog feedback signal AFS by a D/A-converter circuit DACC, and compared with the analog input signal AIS by a summing point. In FIG. 2 the border between the analog domain AD and digital domain DD is illustrated by a dashed line, but it is noted that no precise indication of where the signal changes from analog to digital can be given, as even a digital output may in some embodiments be used directly in the analog domain, and vice versa.

Typically the filter FI comprises low-pass filtering which attenuates the quantization noise because, according to conventional feedback theory, the low-pass filter acts as a high-pass filter on any noise that is introduced in the forward path after the filter within the loop, e.g. the quantization noise. Furthermore the filter FI should be designed to facilitate the desired modulation. When the modulator is self-oscillating, the filter FI should for example facilitate a phase shift of −180 degrees at the desired switch frequency. It is noted that the filter FI is shown in the forward path, but it could as well within the scope of the invention be designed for the feedback path, or be distributed as filter parts at different places in the circuit.

The pulse generator PG typically comprises a comparator either comparing the filtered analog input signal AIS with a periodic waveform, e.g. a sawtooth signal, or comparing the filtered analog input signal AIS with a fixed reference voltage or ground, in the self-oscillation case. Also any other technique for establishing pulse width modulation is within the scope of the invention, e.g. using hysteresis, or more complex and advanced pulse generation techniques.

The typically continuous, however pulsed and amplitude quantized output in PWM format from the pulse generator PG is converted into a digitally represented PWM signal by a time quantization and/or sampling circuit QSC. In a preferred embodiment the time quantization and/or sampling circuit simply comprises a fast running latch or a cascaded double latch as a time quantizer, but the quantization and/or sampling circuit QSC may comprise any means for establishing a signal representation that is suitable for processing in the digital domain, e.g. other latch configurations or variants and simple A/D-converters, etc. It is noted that in the present description the term latch is considered including both transparent and non-transparent devices, e.g. clocked devices, even though the latter is in some texts referred to with the term flip-flop. Thus, both latches, flip-flops and any other alternatives are within the scope of the present invention for all devices referred to as latches below. The quantization rate compared to the PWM rate controls the amount of quantization errors introduced due to non-concurrent PWM- and clock-edges, and the quality of the quantization clock controls the amount of jitter error added. At least the quantization error type is however quite effectively suppressed by the feedback loop and filter, but regarding the jitter error, feedback suppression is in practice less effective as jitter errors are also introduced in the feedback path even in loops without a dedicated D/A-converter, and the probably jittery quantization clock is in practice used also for a D/A-converter thereby re-introducing any suppressible jitter errors. In a preferred embodiment the quantization clock runs a 100 times faster than the PWM frequency, thereby providing 100 possible time quantization steps for each PWM pulse, but also any other ratio is within the scope of the present invention, and should be chosen according to desired overall quality. The quantized signal may furthermore be used directly, or be preprocessed prior to indexing, e.g. by applying filtering or performing decimation of the fast quantization rate.

It is noted that any pulse width modulation PWM technology may be used in an A/D-converter according to the present invention, e.g. comparator-based, hysteresis-based, self-oscillating, etc. Self-oscillating modulators are preferred for some embodiments and applications, as they provide higher error suppression, compared to classic triangle based PWM modulators, given the same analog circuit complexity and that they do not need any reference waveform. Furthermore, any type of modulation or encoding, e.g. NPWM or LPWM, single-ended or differential, two-level, three-level or multi-level PWM, etc. is within the scope of the present invention.

The D/A-converter circuit DACC illustrated in the feedback path is shown with dashed lines because in a simple PWM A/D-converter it may not actually be a distinct block in the feedback path. When for example using a latch for the quantization and/or sampling circuit QSC, a basically analog, i.e. continuous, output may be established by the hold circuit of the latch. In some configurations and provided the amplitude ranges correspond, this signal can therefore be used directly as analog feedback signal AFS and no additional D/A-converter circuit DACC is required.

It is noted, however, that even when no D/A-converter is present because an output of the quantization and/or sampling circuit QSC can be used directly as analog feedback, jitter errors are introduced in the feedback path by the quantizer QSZ and therefore not suppressed by the filter FI. Therefore, jitter errors will be present in the feedback signal regardless of the method used for establishing an analog feedback signal AFS. In the following are described embodiments of the present invention that improves the influence such jitter is allowed to have in A/D-converters according to the present invention.

FIG. 3 illustrates a PWM A/D-converter as described with reference to FIG. 2, but in FIG. 3 a dedicated D/A-converter circuit DACC is provided in the feedback path. It comprises a latch with a data input receiving the digital feedback signal DFS and a clock signal CLK. In accordance with the clock signal, the latch samples and holds the digital feedback signal, and thereby provides at its output Q an analog feedback signal substantially corresponding to the digital feedback signal DFS. Depending on the latch configuration the conversion may involve a delay. Due to the clock signal CLK in practice being non-ideal, and therefore comprising jitter, i.e. the edges of the clock not arriving at the exact same interval every time, the conversion performed by the latch introduces a timing error to the feedback signal causing the edges of the analog feedback signal AFS not necessarily being established at exactly at the same time or after exactly the same delay, as the edges of the digital feedback signal DFS.

The D/A-converter DACC driven by a jittery clock CLK may be described as illustrated in FIG. 4. An input signal x is delivered to an ideal D/A-converter establishing an exact true continuous representation of x. An error source ES provides an error signal e which is added to the true analog representation, resulting in the somewhat erroneous output y. The error signal e corresponds to the jitter error introduced by a jittery clock, which to some extent all clocks in practice are. The output y is therefore y=x+e.

A timing diagram illustrating the jitter error is shown in FIG. 5. An example of a two-level pulsed input signal x, e.g. a PWM-signal, and which is obviously also the desired output signal, is shown in the top with dotted lines. In the top is also illustrated the actually outputted signal y in solid lines. As seen, the edges of the established analog representation y do not exactly coincide with the desired edges x.

Below x and y is shown the error signal e, i.e. the jitter error. Because the jitter error is introduced in the feedback path it is not attenuated by the loop and filter FI, and will to some degree affect the overall performance of the A/D converter.

It is noted, that even in an embodiment as described above where no distinct D/A-converter is applied in the feedback path because a hold-circuit of the forward path latch is used to establish an analog feedback signal, the jitter error is to be considered introduced in the feedback path. Hence, such an embodiment will also be affected by a jittery clock.

FIG. 6 illustrates a model of a detail of the present invention, suitable for comparison with the D/A-converter model illustrated in FIG. 4. Instead of only one D/A-converter now n ideal D/A-converters IDAC1 . . . IDACn are placed in parallel, i.e. having same input and their outputs summed. Each signal path is provided with an attenuator to obtain an overall gain of unity. Each D/A-converter comprises an error source ES1 . . . ESn, adding error signals e1 . . . en. The accumulated output y is therefore $$y = \frac{x+e1}{n} + \frac{x+e2}{n} + \ldots + \frac{x+en}{n} = x + \frac{e1+e2+\ldots+en}{n}$$

Instead of using one D/A-converter introducing one error, small or large, for each edge as illustrated in FIGS. 4 and 5, the embodiment of the invention illustrated in FIG. 6 assigns the conversion task to n D/A-converters to each establish a conversion including an error, small or large, and then establishes an average output y from the n suggested outputs y1 . . . yn. Provided that the errors e1 . . . en are uncorrelated, and distributed evenly to both sides of zero, the averaging of the D/A-converter outputs and thereby also the error signals, causes the total error variance to be reduced.

Obviously more D/A-converter instances, i.e. a higher number n improve the averaging. Formalizing the accumulated error, and assuming the individual error signals are uncorrelated, results in a total RMS noise level of:

$$e_{TOT} = \sqrt{\left(\frac{e1}{n}\right)^2 + \left(\frac{e2}{n}\right)^2 + \ldots + \left(\frac{en}{n}\right)^2}$$

Assuming also that the error signals have the same level, e, the resulting output signal y equals:

$$y = x + \sqrt{n \cdot \left(\frac{e}{n}\right)^2} = x + e \cdot \sqrt{\frac{1}{n}}$$

This last equation clearly shows that for every doubling of D/A-converters, n, the noise will decrease by an amount corresponding to $\sqrt{2}$, i.e. approximately 3 dB. The acceptable jitter noise level in the feedback path can therefore be controlled by simply using a relevant number of D/A-converters, provided their individual error contributions are uncorrelated. In practice, this can for example be achieved by driving each D/A-converter by its own, separate clock not derived from any common clock, or by applying jitter randomization, e.g. by phase locked loops, to a number of individual clock derived from a common clock.

As jitter errors are not easily handled by filtering or other suppressive acts due to their arbitrary, uncorrelated, white noise nature, and therefore typically simply adds to a white-noise noise floor in the utility signal, the present invention provides an advantageous way of instead reducing the consequences of the inevitable jitter error, i.e. by averaging several uncorrelated jitter error instances.

A timing diagram illustrating the jitter error in an embodiment of the present invention as described with reference to FIG. 6 is shown in FIG. 7. In the example n is four and therefore four pairs of input/desired output x and actual intermediate output y1 . . . y4 are shown. As seen, the dotted diagrams illustrating x are equal, but the solid diagrams illustrating the individually established output y1 . . . y4 are different. Beneath each x, y-pair is shown the individual error signals e1 . . . e4. As mentioned above, the error signals are uncorrelated, in this example by using four uncorrelated, jittery clock signals. Beneath the four individual D/A-converter signal pairs and error signals are shown the overall, accumulated output y compared with the desired signal x. Instead of one, well-defined edge, the output signal y shown in solid lines has now staircase edges, but it is clear that the averages of the staircase edges much better correspond to the desired edge going through approximately the middle of each staircase, than the one erroneous edge in the timing diagram of FIG. 5. Below x and y is shown the error signal e, i.e. the jitter error. Instead of a single positive or negative error for each edge as in FIG. 5, the present embodiment of the invention leads to a more complex error waveform comprising both negative and positive components over a small amount of time for each edge. The variance of the error at each edge is smaller, as shown by the above equations, than the error in the embodiment of FIG. 5. Actually, with four D/A-converters with uniform weight, it follows from the above that the total error is only $$e \cdot \sqrt{\frac{1}{4}} = e \cdot 0.5,$$

i.e. the half or −6 dB of the error introduced with a single D/A-converter.

FIG. 8 illustrates an embodiment of an A/D-converter according to the present invention. It comprises an analog input signal AIS which is converted into a digital pulse modulated representation output signal DOS by a pulse modulating A/D-converter PMAD, comprising e.g. a filter FI, a pulse generator PG and a quantization and/or sampling circuit QSC. As described above, the illustrated elements of the pulse modulated A/D-converter PMAD are to be regarded example elements illustrating the principle functioning and may within the scope of the present invention comprise several different embodiments and utilize several different technologies, e.g. pulse width modulation or delta-sigma modulation, as long as a pulse modulated digital signal is established at the output.

The A/D-converter of FIG. 8 is further arranged with a feedback to suppress errors, mainly quantization errors introduced in the pulse modulated A/D-converter. A digital feedback signal DFS is derived from the digital output signal DOS and converted into an analog feedback signal AFS which is subtracted from the analog input signal AIS by a summing point or other suitable feedback processing circuit, e.g. a filter. The conversion of the digital feedback signal DFS into an analog feedback signal AFS is performed by a jitter consequence reducing D/A-converter JRDA. In the embodiment of FIG. 8, the jitter consequence reducing D/A-converter JRDA is arranged according to the principles described above regarding FIGS. 6 and 7, and comprises a number n of D/A-converters, e.g. latches, coupled in parallel, i.e. having same input. Each latch receives a copy of the digital feedback signal and performs a conversion thereof. The resulting n converted signals are added according to preferably equal weights R to establish the analog feedback signal AFS. In order for the n conversions to provide jitter error averaging, the latches should be clocked with clocks comprising uncorrelated jitter, as explained above. The embodiment of FIG. 8 therefore comprises n clock signals CLK1 . . . CLKn. The n uncorrelated clock signals could be derived from n different clock generators, e.g. crystals, but could also be derived from a single master-clock and processed by n individual phase-locked loops PLL, e.g. based on inherently relative low quality voltage controlled oscillators VCO, or other clock processing means which typically would each establish it own jitter error, uncorrelated with the other PLL's. In preferred embodiments the different clock signals CLK1 . . . CLKn are synchronized, but with uncorrelated jitter.

FIG. 9 illustrates an embodiment of a jitter consequence reducing D/A-converter JRDA according to a different approach of the invention. When looking at a single clock signal, the jitter error at each edge can typically be considered uncorrelated with the jitter error at other edges. Hence, letting each latch of the partial D/A-converters convert the digital signal by using different edges of a single clock will resemble using different clocks. Over time the jitter error of a single clock signal typically resembles white noise, probably with an amount of pink noise or 1/f-noise in the lower part of the spectrum, and with a Gaussian distribution of the jitter amount around zero because the jitter is typically random and arbitrary in nature, and therefore averaging the jitter of several, n, clock edges will for an increasing number n approach zero. FIG. 9 illustrates an embodiment where different edges of a single clock CLK are used for the conversion of the same digital signal. The jitter consequence reducing D/A-converter of FIG. 9 comprises n latches L1 . . . Ln, which are coupled in series in the sense that the output Q of the first latch L1 is used as input D for the second latch L2, etc. Each output D is also used to accumulate an average analog feedback signal AFS at the output of the jitter consequence reducing D/A-converter by n resistors R1 . . . Rn or equivalent means. All latches are clocked by the same clock CLK, and therefore the jitter error associated with a certain clock edge will be applied to all latches simultaneously. However, all latches do not process the same part of the digital feedback signal DFS simultaneously because of the delay in each latch and series coupling thereof. The result is that each part of the input signal, the digital feedback signal DFS is converted by n latches with uncorrelated jitter, but just not at the exact same time.

The embodiment of FIG. 9 is described in further detail with regard to FIG. 10, which illustrates a model of the jitter consequence reducing D/A-converter of FIG. 9, and which can be compared with the model described above with reference to FIG. 6. Comparing with FIG. 6, delays are inserted in FIG. 10 prior to each of the n ideal D/A-converters IDAC1 . . . IDACn in FIG. 10. The rest of the configuration is the same as in FIG. 6. With the embodiment of FIG. 9, the delays correspond to one latch-delay, and each latch receives the input signal x one such delay later than the previous. It is noted, however, that any number and length of delays can be used, and are within the scope of the present invention. Assuming uncorrelated equal level noise sources ES1-ESn, i.e. assuming that the different edges of one clock have uncorrelated jitter, the accumulated output y in FIG. 10 is $$y(i) = \frac{x(i)+e1}{n} + \frac{x(i-1)+e2}{n} + \ldots + \frac{x(i-n-1)+en}{n}$$

$$= \frac{x(i) + x(i-1) \ldots + x(i-n-1)}{n} + \frac{e1 + e2 + \ldots + en}{n}$$

As seen, the errors are averaged as with the embodiment of FIG. 6, but the utility part of the output signal y comprises parts from n different time slots of the input signal x. As with the embodiment of FIG. 6, the accumulated error results in a total RMS noise level of:

$$e_{TOT} = \sqrt{\left(\frac{e1}{n}\right)^2 + \left(\frac{e2}{n}\right)^2 + \ldots + \left(\frac{en}{n}\right)^2}$$

And the resulting output signal y equals:

$$y = \sum_{k=0}^{n-1} \frac{x(i-k)}{n} + e \cdot \sqrt{\frac{1}{n}}$$

As for the error e this last equation equals the resulting equation referring to the embodiment of FIG. 6, and shows that for every doubling of D/A-converters, n, the noise will decrease by an amount corresponding to $\sqrt{2}$, i.e. approximately 3 dB. The acceptable jitter noise level in the feedback path can therefore be controlled by simply using a relevant number of D/A-converters. As for the utility part of the signal, the equation shows that an averaging or low pass filtering is performed to the utility signal. Since the data speed in most bit stream converters are very fast, e.g. several MHz, and the number of averages n typically will be limited to below e.g. 100, the resulting consequences in the frequency domain can often be neglected. Of course, if desired, the low pass filter effect can be counteracted in the digital domain prior to the conversion.

FIG. 11 illustrates a preferred embodiment of an A/D-converter according to the present invention using the D/A-conversion principle described above with reference to FIGS. 9 and 10. It comprises an analog input signal AIS which is converted into a digital pulse modulated representation output signal DOS by a pulse modulating A/D-converter PMAD, comprising e.g. a filter FI, a pulse generator PG and a quantization and/or sampling circuit QSC. As described above, the illustrated elements of the pulse modulated A/D-converter PMAD are to be regarded example elements illustrating the principle functioning and may within the scope of the present invention comprise several different embodiments and utilize several different technologies, e.g. pulse width modulation or delta-sigma modulation, as long as a pulse modulated digital signal is established at the output.

The A/D-converter of FIG. 11 is further arranged with a feedback to suppress errors, mainly quantization errors introduced in the pulse modulated A/D-converter. A digital feedback signal DFS is derived from the digital output signal DOS and converted into an analog feedback signal AFS which is subtracted from the analog input signal AIS by a summing point or other suitable feedback processing circuit, e.g. a filter. The conversion of the digital feedback signal DFS into an analog feedback signal AFS is performed by a jitter consequence reducing D/A-converter JRDA. In the embodiment of FIG. 11, the jitter consequence reducing D/A-converter JRDA is arranged according to the principles described above regarding FIGS. 9 and 10, and comprises a number n of D/A-converters, e.g. latches, coupled in series. Each latch receives at its input D the output Q from the previous latch. The first latch receives as input the digital feedback signal DFS to be converted. The resulting n converted signals are added according to preferably equal weights R to establish the analog feedback signal AFS. In order for the n conversions to provide jitter error averaging, the latches should be clocked with a clock CLK comprising uncorrelated jitter at each edge, as explained above.

A timing diagram illustrating the jitter error in an embodiment of the present invention as described with reference to FIG. 9-11 is shown in FIG. 12. In the example n is four and therefore four pairs of input/desired output x and actual intermediate output y1 . . . y4 are shown. As seen, the dotted diagrams illustrating x are equal except from the delays deferring the pulse a bit extra for each line: The solid diagrams illustrating the individually established output y1 . . . y4 are different not only because of the delays, but also because of the different jitter applied in each line. Beneath each x, y-pair are shown the corresponding error signals e1 . . . e4. As mentioned above, the error signals are uncorrelated, in this example by using four different, uncorrelated, edges of the same clock for conversion of each edge of the input signal x. The error signals are clearly not equal. Beneath the four individual D/A-converter signal pairs and error signals are shown the overall, accumulated output y compared with the desired signal x. As seen the signal as well as the noise is smeared a bit in the time domain resulting in a staircase waveform, but assuming the jitter of different clock edges are uncorrelated, and that the low-pass filtering effect applied to the utility part of the signal is acceptable, the averaging effect on the jitter error is as effective and valid as in the previous example with latches coupled in parallel, i.e. having same input and n individual, uncorrelated clock signals. Below x and y is shown the error signal e, i.e. the jitter error. Instead of a single positive or negative error for each edge as in FIG. 5, or a complex combined error pulse as in FIG. 7, the present embodiment of the invention leads to individual negative and positive error pulses distributed over the width of the staircase "edge". Comparing with the timing diagram of FIG. 5 illustrating the error of a one-latch D/A-converter, it is further clear, noting that the vertical axes of the two timing diagrams are of the same scale, that the total error for each utility signal edge is far better in the embodiment of FIG. 12, as the total of, e.g., the first four error pulses in the lower-most signal e will be close to zero, and clearly not approaches anything near the error shown in the lower-most signal e of FIG. 5 which is four times the level of any of the four individual error pulse of FIG. 12, and has no corresponding negative compensation pulse. As with the embodiment of FIG. 7, the accumulated error associated with each edge of x is in average only:

$$e \cdot \sqrt{\frac{1}{4}} = e \cdot 0.5,$$

i.e. the half or −6 dB of the error introduced with a single D/A-converter.

It is noted that even though preferred embodiments of jitter consequence reducing D/A-converters JRDA for use in A/D-converters according to the present invention comprise equal weighing of each latch output for the accumulated output, and equal delays through each latch, but other configurations are perfectly possible and within the scope of the present invention. For example, if the jitter error cannot be considered broad or flat spectrum, or if is not Gaussian distributed around zero, different weighing of the individual converters may reduce the applied jitter better than the described equal weights leading to a moving average filter. Likewise, if a different signal filtering is desired, or if the low-pass filtering applied by the above-described delay configuration is not acceptable, different weighing and delays may shape the signal differently.

Also, according to a preferred embodiment of the present invention, the delay introduced by an embodiment according to e.g. FIG. 11 can be halved by configuring the latches to forward an output at both leading and trailing edges of the clock square-wave instead of typically using only the leading edges. The assumption that the jitter at each edge of the clock is uncorrelated does also apply to leading and trailing edges in the sense, that the jitter of a trailing edge is not correlated with the jitter of the previous leading edge, nor with the jitter of the subsequent trailing edge, etc. Thus, for the purpose of obtaining uncorrelated clock edges, both leading and trailing edges could as well be used.

In a variant of the above described embodiments with serially coupled partial D/A-converters, e.g. latches, the digital feedback signal DFS is upsampled before conversion by one of the above-described embodiments with an accordingly faster clock. The faster clock causes the same number of latches or D/A-converters to apply a shorter delay in terms of absolute time, while still achieving the same degree of where a delay of e.g. 50 latches at the pulse rate of the A/D-converter, e.g. 3 MHz in a delta-sigma modulator would be long enough to contribute with errors in the utility signal band, but by clocking the e.g. 50 latches at e.g. 12 MHz, the delay is 4 times shorter in absolute time, and thus still preserve an option for overall high loop gain, without loop stability problems.

In a further variant of the invention the delay from latch to latch, or in broader terms, from delay line tap to delay line tap, is far longer than a single or half clock period in order to achieve an embodiment where the signal is delayed e.g. half a PWM period for each tap. In a preferred embodiment only two taps are provided, but with a delay of half a PWM period between. The addition performed to establish the analog feedback signal is thereby an addition between a half-magnitude signal with a phase shift of 0 degrees and a half-magnitude signal with a phase shift of 180 degrees. A signal processed in this way is comb filtered, but the errors derived from jitter the delay line clock are in addition to the averaging explained above, also subject to cancellation every time an edge in the phase shifted signal coincides with an edge in the non-phase shifted signal, because the jitter errors added to the coinciding edges are equal. This embodiment is particularly advantageous for digital PWM feedback signals encoded so that a fifty-percent duty cycle corresponds to zero, because phase shifting a fifty-percent duty cycle square-wave signal leads to an inverted signal with only coinciding edges, which when added to the non-shifted signal results in a zero-representing analog signal with all jitter errors cancelled. With positive or negative signals the error cancellation becomes rare, but in that case the noise is not as significant as for silent signals. Evidently other phase shifts, other number of taps, other weighting of taps, etc., are within the scope of the present invention and may be particularly advantageous for signal types where coinciding edges can be caused by other shifting, etc.

FIG. 13 illustrates a differential embodiment of an A/D-converter according to the present invention. In this embodiment, two differential analog input signals AIS+, AIS– are fed to a differential pulse modulation A/D-converter PMAD with a filter FI, delivering a single signal to a pulse generator PG establishing a single e.g. analog PWM signal, and a quantizer QZ, e.g. a fast-running latch, for establishing a corresponding digital output signal. In order to obtain a differential output signal, both the regular and complement outputs at the quantizer are used to obtain a digital output signal DOS+ and the complement thereof DOS–. In order to suppress errors, e.g. quantization errors, feedback is established by feeding a digital feedback signal DFS+ and a complement digital feedback signal DFS– via jitter consequence reducing D/A-converters JRDA and resulting analog feedback signal AFS+ and complement analog feedback signal AFS–. The jitter consequence reducing converters JRDA may comprise any of the D/A-converter embodiments described above, any combinations thereof, or any other suitable D/A-converters with reduced consequential jitter.

FIG. 14 illustrates an alternative differential embodiment of an A/D-converter according to the present invention. This embodiment corresponds to the embodiment of FIG. 13, except from only one of the two digital output signals being fed back. The single digital feedback signal DFS+, in this example derived from the regular digital output signal DOS+, is provided to a jitter consequence reducing D/A-converter JRDA. By using both the regular and complement outputs of each latch inside the jitter consequence reducing D/A-converter is obtained an analog feedback signal AFS+ and a complement analog feedback signal AFS–, both comprising reduced consequential jitter according to the principles of the present invention, and suitable for subtraction from the analog input signal AIS+ and the complement analog input signal AIS–, respectively.

An experiment was carried out based on a differential A/D-converter as described above with reference to FIG. 14 with a self-oscillating pulse modulation A/D-converter PMAD oscillating at a PWM switch frequency of approx. 3.2 MHz, and having a jitter consequence reducing D/A-converter comprising 14 serially-coupled latches, which according to the above in theory, compared to a single latch, should lead to a jitter consequence reduction of:

$$\sqrt{\frac{1}{14}} \approx 0.27 \approx -11.5 \text{ dB}$$

Because the switch frequency of a self-oscillating A/D-converter depends on the delay in the feedback loop, the difference between 1 and 14 latches could not be fairly judged without adding an extra delay in the 1-latch reference circuit to obtain the same switch frequency. The average delay added to the signal by the 14 latches in the experiment was approximately 40 ns, and therefore a 40 ns delay was added to the feedback path of the 1-latch reference circuit. The experiment showed a difference in jitter consequence errors in the analog feedback path from the 1-latch reference circuit to the 14-latch test circuit of approx. –10 dB or less than ⅓. This result was very close to the theoretical benefit, and clearly proves that the concept of the present invention also works very advantageously in practice.

It is noted that the principles of the differential embodiments illustrated in FIGS. 13 and 14 can be applied to any of the embodiments of A/D-converters described in the present application, within the scope of the invention. It is further noted, that any of the jitter consequence reducing D/A-converter embodiments described above can be used with any of the differential A/D-converter embodiments within the scope of the present invention, and should not be limited to the illustrated serial configurations.

FIG. 15 illustrates a multi-bit version of an A/D-converter according to an embodiment of the present invention. An analog input signal AIS is filtered and pulse modulated, e.g. pulse width modulated, by a filter FI and a pulse generator PG within a pulse modulation A/D-converter. A multi-bit A/D-converter established a multi-bit output signal MBOS being a digital representation of the analog input signal AIS. The multi-bit output signal may within the scope of the present invention be converted by post-processing means, not shown, into a suitable data format is so desired. Moreover, the multi-bit output signal MBOS is fed back as a multi-bit feedback signal MBFS via a jitter consequence reducing D/A-converter JRDA converting the multi-bit feedback signal MBFS into an analog feedback signal AFS compatible with the analog input signal AIS, in order to enable feedback suppression of errors, e.g. quantization errors.

The illustrated multi-bit output signal MBOS may e.g. comprise a multi-level signal, typically relatively few different levels in order to minimize the possible non-linearities in the obtained signal.

A multi-bit D/A-converter embodiment according to the present invention suitable for use as jitter consequence reducing D/A-converter JRDA in the multi-bit A/D-converter embodiment of FIG. 15, is illustrated in FIG. 16. This embodiment comprises a 3-bit D/A converter with reduced consequential jitter, but the embodiment can easily be extended to accept any number of bits. Each bit of the multi-bit feedback signal MBFS is fed to its own sequence of serially-coupled lathes. Each of these series therefore performs a D/A-conversion of a single bit according to the principles of the present invention, described in more detail above, e.g. with regard to FIG. 9. The same clock is used all three latch series. In order to average the consequential jitter even more, three uncorrelated clock signals could be used. The outputs of each series of latches, i.e. the three individual one-bit conversions, are added together according to different weights R0, R1 and R2 because of the individual bit's different significance in the digital domain. In a typical embodiment, the least significant bit should be weighed half the next bit, and the most significant bit should be weighed double the previous bit.

It is noted that the principles of the multi-bit embodiment illustrated in FIGS. 15 and 16 can be applied to any of the embodiments of A/D-converters described in the present application, within the scope of the invention. It is further noted, that any of the jitter consequence reducing D/A-converter embodiments described above can be used with the multi-bit A/D-converter embodiment within the scope of the present invention, and should not be limited to the illustrated serial configurations. For example, a parallel configuration as illustrated in FIG. 8 could be applied to each bit of a multi-bit jitter consequence reducing D/A-converter.

FIG. 17 illustrates an embodiment of a 3-level A/D-converter according to an embodiment of the present invention. It comprises an analog input signal AIS which is processed by a filter FI and then provided to a pulse generator PG+, in this example a comparator establishing a double-sided pulse width modulation by comparing with a triangle reference signal RS. It is noted that any kind of pulse width modulation is within the scope of the present invention. An inverse representation of the filtered analog signal is fed to a further pulse generator PG− which establishes a pulse width modulated representation of the inverted signal, in this example on the basis of the same reference signal RS as the modulation of the non-inverted signal. Both the non-inverted and inverted pulse width modulated representations are converted into digital signals by a quantization and/or sampling circuit QSC+, QSC−, respectively. The digital PWM signals, together forming a 3-level representation of the analog input signal, is in this example subtracted from each other by a summing point, thereby causing a single 3-level digital output signal DOS representing the analog input signal AIS. Digital feedback signals DFS+, DFS− are derived from the non-inverted and inverted digital PWM signals respectively, and each converted into analog feedback signals AFS+, AFS− by means of jitter consequence reducing D/A-converters JRDA+, JRDA− according to any of the above described embodiments of such. The two D/A-converters JRDA+, JRDA− should be provided with the same clock signal CLK. This causes them to establish the exact same jitter errors in each of the two analog feedback signal AFS+, AFS−. A very advantageous feature of the 3-level embodiment of the present invention is that when the non-inverted and inverted feedback signals AFS+, AFS, respectively, are applied to the analog input signal AIS by subtracting the non-inverted feedback signal and adding the inverted feedback signal, the two feedback signals are in practice subtracted from each other. This causes any equal signal components in the two feedback signals to be cancelled, and because the jitter errors in the two signals are equal, they will be cancelled by a 3-level PWM A/D-converter or other 3-level pulse modulated converter according to the present invention.

FIG. 18 illustrates an embodiment of a 3-level A/D-converter based on self-oscillation according to an embodiment of the present invention. It comprises an analog input signal AIS which in a non-inverted path is processed by a filter FI+ and then provided to a pulse generator PG+, in this example a comparator establishing a pulse width modulation by comparing with ground. The pulse generation is established according to principles for self-oscillation as described above, where the loop, filter and possibly other elements together form an open loop phase shift of 180 degrees at the desired switch frequency. This causes a low-level, fast-switching signal to be superposed onto the utility signal, and the comparing with ground by the comparator causes a pulse modulation to be the effective result. It is noted that any kind of pulse width modulation is within the scope of the present invention. Additionally, an inverse representation of the analog input signal is fed to a further filter FI− and on to a further pulse generator PG− which by the same self-oscillation principles explained above establishes a pulse width modulated representation of the inverted signal.

Because self-oscillating modulation loops may cause the switch frequency to drift a little, synchronization means SYM is provided between the two self-oscillating loops. In a preferred embodiment the synchronization means SYM simply comprises capacitors coupled between the non-modulated signal paths of the two loops, thereby causing high-frequency content to be shared and equalized in the two signals, including the superposed high-frequency switch signals. It is noted that any synchronization means SYM, including active synchronization means based on reference generators and/or logics are within the scope of the present invention.

Both the resulting non-inverted and inverted pulse width modulated representations are converted into digital signals by a quantization and/or sampling circuit QSC+, QSC−, respectively, as in the embodiment of FIG. 17, and accordingly together forming a 3-level representation of the analog input signal, and subtracted from each other by a summing point causing a single 3-level digital output signal DOS representing the analog input signal AIS to be established. As in the embodiment of FIG. 17 digital feedback signals DFS+, DFS− are derived from the non-inverted and inverted digital PWM signals respectively, and each converted into analog feedback signals AFS+, AFS− by means of jitter consequence reducing D/A-converters JRDA+, JRDA− according to any of the above described embodiments of such. The two D/A-converters JRDA+, JRDA− should be provided with the same clock signal CLK. This causes them to establish the exact same jitter errors in each of the two analog feedback signal AFS+, AFS−. A very advantageous feature of the 3-level embodiment of the present invention is that when the non-inverted and inverted feedback signals AFS+, AFS, respectively, are applied to the non-inverted and inverted versions, respectively, of the analog input signal AIS by subtraction, even though not physically applied at the same location, the two feedback signals are in practice subtracted from each other, thereby causing any equal signal components in the two feedback signals to be cancelled, including the equal jitter errors.

In a variant of the above-described 3-level pulse modulation embodiment referring to FIGS. 17 and 18, the D/A-converters in the feedback paths are not jitter consequence reducing D/A-converters according to the present invention, but simply any D/A-converter or equivalent means, e.g. sample-and-hold outputs of the A/D-quantization and/or sampling circuits QSC+, QSC−. Such variant embodiments still benefit from the jitter error cancellation caused by subtracting the feedback signals from each other, and are therefore advantageous.

In a variant of the 3-level embodiments of the present invention, the 3-level PWM signals are encoded into a sign/magnitude representation.

It is noted that the 3-level embodiments of A/D-converters are advantageous for several reasons, even without utilizing the jitter consequence reducing D/A-converters of the present invention. The 3-level A/D-converters with feedback are less sensitive to power supply noise and jitter, all things considered.

FIG. 19 illustrates an embodiment of an A/D-converter according to the present invention. The embodiment of FIG. 19 resembles the 3-level embodiment of FIG. 17, except that in FIG. 19 the further pulse generator does not process an inverted representation of the input signal but simply the value zero, by grounding its input. Only the non-inverted PWM representation is used for the digital output signal DOS, which is therefore only a 2-level signal in this example. The negative feedback path instead comprises a zero feedback signal ZFS. It is however converted into an analog feedback signal AFS− in the same manner, and by the same clock CLK, as the positive, digital feedback signal DFS+ is converted into an analog feedback signal AFS+. As explained above, the jitter error established by the two jitter consequence reducing D/A-converters JRDA is exactly equal, and as the zero feedback signal ZFS and the resulting negative analog feedback signal AFS− represents a signal value of zero, the input signal is not affected by the addition of this feedback signal to the analog input signal. On the other hand, the negative, zero, analog feedback signal AFS− comprises jitter errors equal to the jitter errors of the positive feedback signal AFS+, and these errors are therefore cancelled.

A more general description of embodiments of jitter consequence reducing D/A-converters JRDA and aspects and realizations related thereto are given below with reference to FIG. 20-29.

Figure 20:
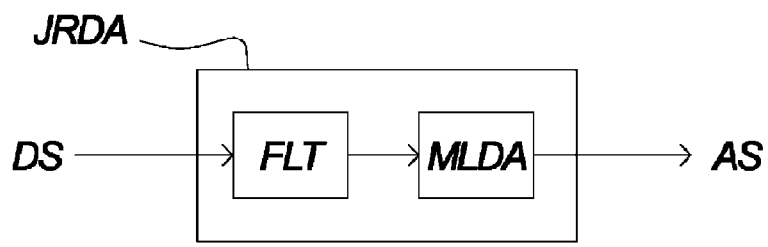

FIG. 20 illustrates a jitter consequence reducing D/A-converter according to the present invention. It comprises a filter FLT and a multi-level D/A-converter MLDA. A digital signal DS is processed by the filter FLT and the multi-level D/A-converter MLDA in order to establish an analog signal AS.

Figure 21:
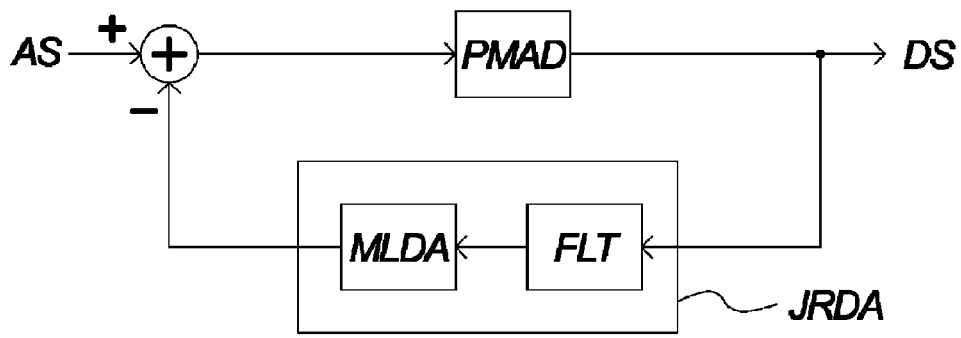

FIG. 21 illustrates an embodiment of an A/D-converter utilizing a jitter consequence reducing D/A-converter JRDA according to FIG. 20. It comprises a pulse modulated A/D-converter PMAD for converting an analog signal AS into a digital signal DS, and a feedback comprising the jitter consequence reducing D/A-converter JRDA The filter FLT comprises any filtering or in principle other processing that shapes, converts, filters, limits, etc. the digital signal DS into a representation that is more robust to jitter, or in other words is less susceptible to jitter errors. Such filtering preferably comprises removing, attenuating or shaping of high frequency components in the digital signal DS, as these components are far more damaged by a certain jitter error than low frequency components. In most practical applications the high frequency components are established by a pulse modulation of low frequency utility content, and the high frequency content is therefore not per se necessary for preserving the utility information. In such modulated signals, the timing of edges carries information about amplitudes of a low-frequency component. That jitter affects high frequency components more than low frequency components can be recognized by considering that a certain jitter error, which in the first place is a timing error, will lead to a greater amplitude error if applied to a steep curve or edge than if applied to a gentle and smoother curve. In other words, it is kind of the same problem as when sampling an analog signal: within a certain time comparable to a jitter error, a fast changing continuous signal will change more than a slowly changing continuous signal, and the same time error thereby leads to different amplitude errors.

Figure 22:
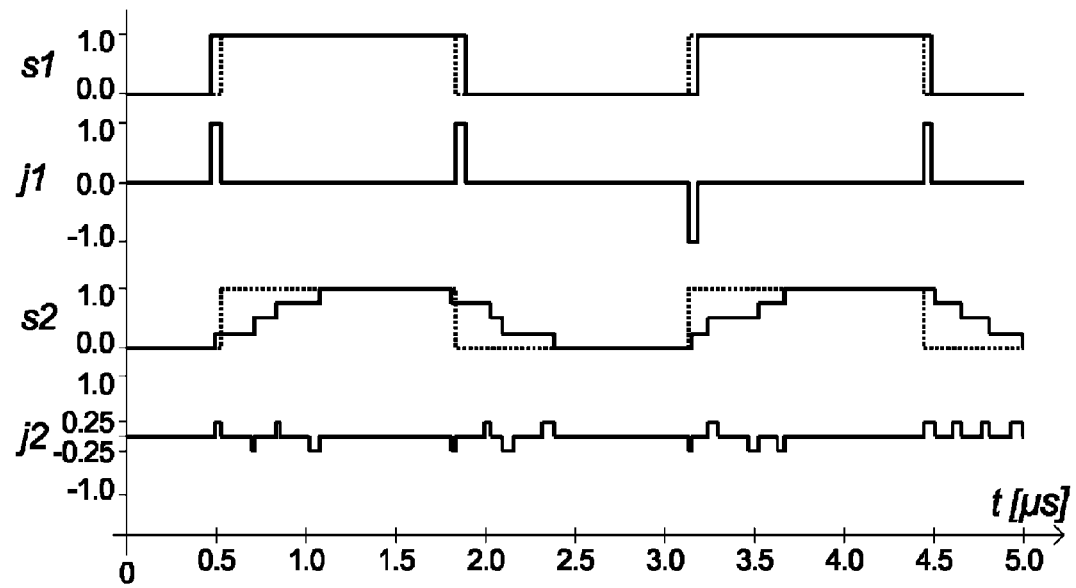

This is also illustrated in FIG. 22. The first graph s1 illustrates a digital signal with a great amount of high frequency components due to the steep, fine square-wave pulses. The dotted graph represents the digital input to a D/A-converter, and the solid graph represents the output of a conversion based in a jittery clock. The second graph j1 illustrates the consequential error as the difference between the dotted and solid graphs above. The third graph s2 illustrates a digital signal with a smaller amount of high frequency content. The dotted graph represents the digital input do a D/A-converter, and the solid graph represents the output of a conversion which both includes filtering to remove some of the high frequency content and thereby establish a digital stair-case waveform instead of steep pulses, and then a conversion based on a jittery clock. Practical embodiments that would lead to the graphs s1 and s2 are described above with reference to FIGS. 3 and 11, respectively. In FIG. 12 is furthermore illustrated the intermediate, filtered digital version of the staircase waveform. The fourth graph j2 illustrates the consequential error as the difference between the intermediate, digital stair-case signal and the solid, output staircase signal above. Noting that the amplitude scaling of j1 and j2 are equal, it can be seen that the errors derived from the jitter in the second case are small and occur in groups within which the jitter almost cancel itself out, whereas the jitter error in the first case are significant, and only over long time cancels itself.

The filtering, shaping, or other processing performed by the filter FLT of a jitter consequence reducing D/A-converter according e.g. FIG. 21, preferably comprises some kind of low-frequency passing, high frequency attenuating filter, e.g. simple low-pass filters, comb-filters, low-pass filters with high frequency "ripple"-design/notches, etc. Any kind of filter or processing that preserves utility information and removes some of the high frequency content is within the scope of the present invention. The running average kind of filtering performed by several serially coupled latches as e.g. illustrated in FIG. 11 is an example of such filtering.

The multi-level D/A-converter MLDA of FIGS. 20 and 21 may comprise any device that receives digital information and establishes an analog representation in more than 2 levels. Several serially coupled latches as e.g. illustrated in FIG. 11 is an example of such D/A-conversion, whereas the 2-level output obtainable from a single latch as e.g. illustrated in FIG. 3 is not considered a multi-level signal. It is noted that the term multi-level in this context refers to the analog output, and not the digital input. Preferred embodiments of the present invention, however, comprises filtering FLT which output more digital levels than it receives, and these intermediate levels are reproduced in an analog signal. Thereby, the digital signal DS input to the filter FLT may very well, e.g. in a PWM, PDM or other bitstream implementation, comprise a 2-level signal. But the filtering FLT establishes an intermediate signal representation preserving the information from the digital signal DS but comprising more effective levels, e.g. 16. These multiple levels, e.g. 16, are then established analogously by the multi-level D/A-converter MLDA. It is noted that the preferably multi-level intermediate signal described above is not necessarily a physical signal measurable at a physical node. For example, in the serially-coupled latch embodiment of FIG. 11, it is hard to tell what parts that exactly forms the filter FLT performing the low-pass filtering, and what parts that exactly forms the multi-level D/A-converter MLDA performing the establishment of a multi-level analog signal representation. Therefore, any physical implementation and realization of the filter FLT and multi-level D/A-converter is within the scope of the present invention, also where they are not able to differentiate from each other. The illustrations of FIGS. 20 and 21 are therefore merely to be considered describing the underlying functioning of the invention.

Figure 23:
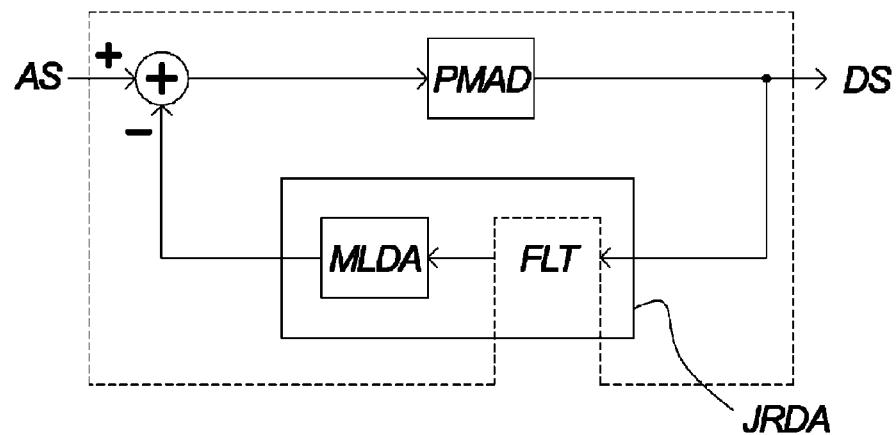

FIG. 23 illustrates an embodiment of an A/D-converter within the scope of the present invention, which further broadens the possible realizations of jitter consequence reducing D/A-converters JRDA according to the present invention. It comprises an analog signal AS that is converted into a digital signal DS by a pulse modulated A/D-converter PMAD. The digital signal DS is fed back and converted into an analog signal compatible with the analog signal AS by means of a jitter consequence reducing D/A-converter JRDA, comprising a filter FLT and a multi-level D/A-converter MLDA. As the dotted enclosing of the filter FLT is meant to illustrate, the filter FLT or at least the filter effect can be distributed over the full circuit, in the sense that any part of the circuit may be enabling or facilitating the filtering that makes the digital signal less influenced by jitter errors, as described above. For example in 3-level A/D converter realizations as illustrated in FIGS. 17 and 18, the mere establishment of 3-levels cause the digital signal to be less susceptible to jitter errors. If the jitter consequence reducing D/A-converters JRDA+ and JRDA− in the embodiments of FIGS. 17 and 18 are established according to e.g. FIG. 11, they further perform a high-frequency reducing filtering, thereby establishing even more levels in the virtual intermediate digital signal, which is thereby made even more jitter robust. Hence, in the context of the above description regarding FIG. 23, the two digital feedback signal DFS+ and DFS− of e.g. FIG. 17 can be considered a single 3-level digital signal DS in FIG. 23, the JRDA+ and JRDA− can be considered forming a single JRDA in FIG. 23, the A/D-conversion that establishes the 3-level signal may together with parts of JRDA+ and JRDA− be considered forming the filter FLT, and parts of JRDA+ and JRDA− may be considered forming the multi-level D/A-converter MLDA.

Figure 24:
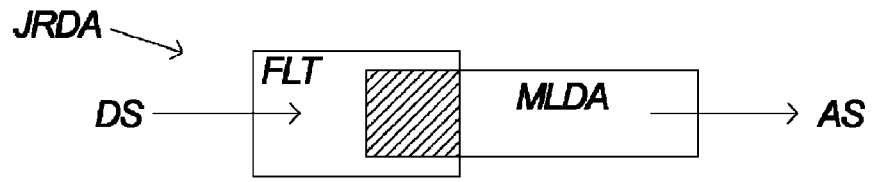

FIG. 24 illustrates an embodiment of a jitter consequence reducing D/A-converter according to the present invention. It comprises a digital signal DS delivered somewhere inside a filter FLT, and from somewhere inside a multi-level D/A-converter MLDA is established an analog signal AS. As also implied above, the filter FLT and multi-level D/A-converter MLDA may overlap each other, as indicated by the hatched area, making it impossible to say in a physical implementation where the multi-level intermediate signal is, or where the filtering ends, and the D/A-conversion begins. The digital signal DS being delivered somewhere inside the filter FLT illustrates the same as FIG. 23, namely that the filter FLT may comprise some parts of the prior processing, whereof some may even be analog parts. The important thing is that the filtering or establishment of more levels is achieved before a jittery clock or other error source is used to establish the analog signal AS. It is noted, that in some embodiments, this may be one and the same thing, i.e. the multiple levels being established by the exact same elements that establishes the analog signal, as long as the error is applied on a multiple level basis and not to the input digital signal levels.

Figure 25:
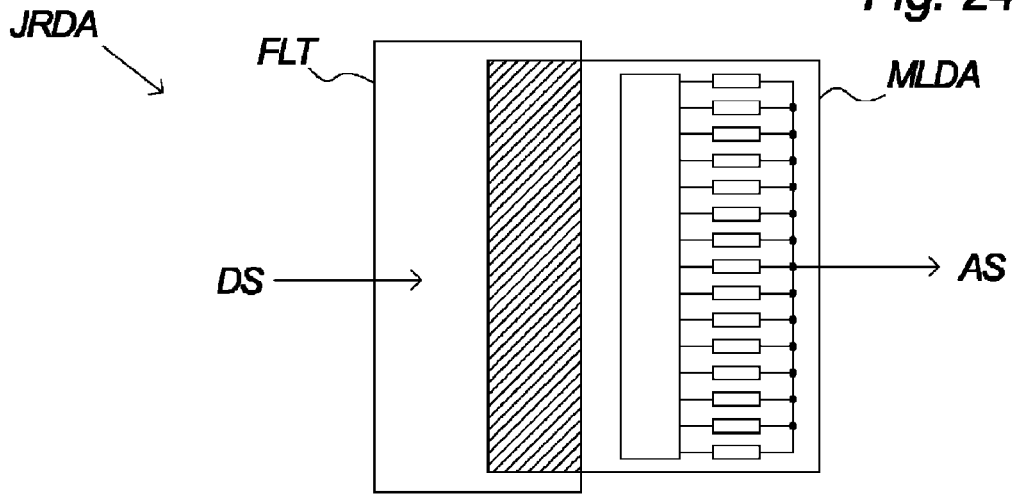

FIG. 25 illustrates an embodiment of a jitter consequence reducing D/A-converter according to the present invention. It comprises a filter FLT and a multi-level D/A-converter MLDA, converting a digital signal DS into an analog signal AS. The multiple analog levels may be established by several resistors, current sources or the like, preferably with equal weighing. The embodiment of FIG. 25 in this regard corresponds to the embodiment of FIG. 11. The embodiment of FIG. 25 comprises 15 preferably equally weighed taps, thereby allowing for establishing a 16-level analog signal when including the zero-level. This configuration of a multi-level D/A-converter may also be referred to as a thermometer DAC.

Figure 26:
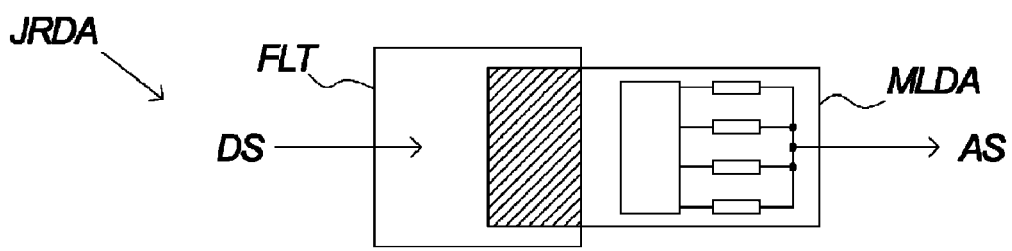

FIG. 26 illustrates a variant of the embodiment of FIG. 25. Only 4 resistors of current sources are provided to establish a multi-level analog signal AS. However, this embodiment may still establish a 16-level analog signal if the resistors or current sources instead of being equally weighed are binary weighed, i.e. each weight being double the previous weight. Thereby each tap resembles one bit of a binary encoded signal representation. With the 4 bits in the example of FIG. 26 it is possible to establish 16 different values, i.e. 16 different levels, exactly as in FIG. 25. The resistors may be connected to 4 latches in parallel, which receives one bit each. The filter FLT takes digital signal DS, e.g. a 2-level PWM, performs some kind of high frequency reducing filtering, e.g. by averaging, and encodes the resulting e.g. 16-level intermediate signal into a 4-bit binary representation. A PWM or other bitstream digital signal will result in a stair-case intermediate signal, which will be established as a multi-level analog signal by e.g. only 4 latches and 4 resistors, whereas embodiments of FIG. 25 may require 15 latches and 15 resistors to establish a corresponding 16-level analog signal.

Figure 27:
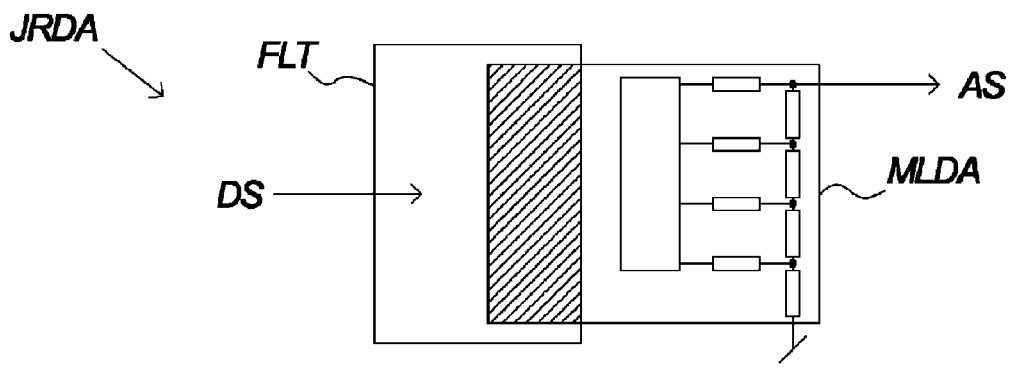

FIG. 27 illustrates a variant of the embodiment of FIG. 26 where a resistor ladder configuration is used to establish a multi-level analog signal from a binary encoded intermediate signal. This embodiment is more robust to inaccurate resistor values than the embodiment of FIG. 26.

It is noted than any other suitable multi-level D/A-converter configuration is within the scope of the present invention, including any combinations of the above, e.g. a so-called segmented DAC being a combination of the thermometer DAC and the binary weighed DAC, where the more accurate equally weighed thermometer configuration is used for the more significant bits, and the less accurate binary weighed configuration is used for the less significant bits.

In a preferred embodiment of the invention according to FIG. 26 or 27, a binary counter may be used for performing the high frequency reducing filtering. By feeding a bitstream, e.g. a PWM signal to a binary counter that is clocked more than twice the desired number of analog levels times faster than the bitstream signal, e.g. more than 32 times faster than the bitstream signal when a 16 level analog signal is desired, and letting the counter count up from 0 to 15 when a leading bitstream pulse edge arrives, and let it count down from 15 to 0 when a trailing bitstream pulse edge arrives, the binary encoded output from the counter will use only 4 bits for representing the counting. These 4 bits may be output to a resistor configuration of either FIG. 26 or 27, or suitably weighed current sources, etc., whereby is established a 16-level analog signal where each edge of the bitstream signal is output as a stair case with 15 steps (16 levels). According to the principles described above, the result will be small amounts of uncorrelated jitter errors on each of the 15 steps, being only square root $1/16$ times the jitter error which would have been obtained by a simple one-bit DAC.

Figure 28:
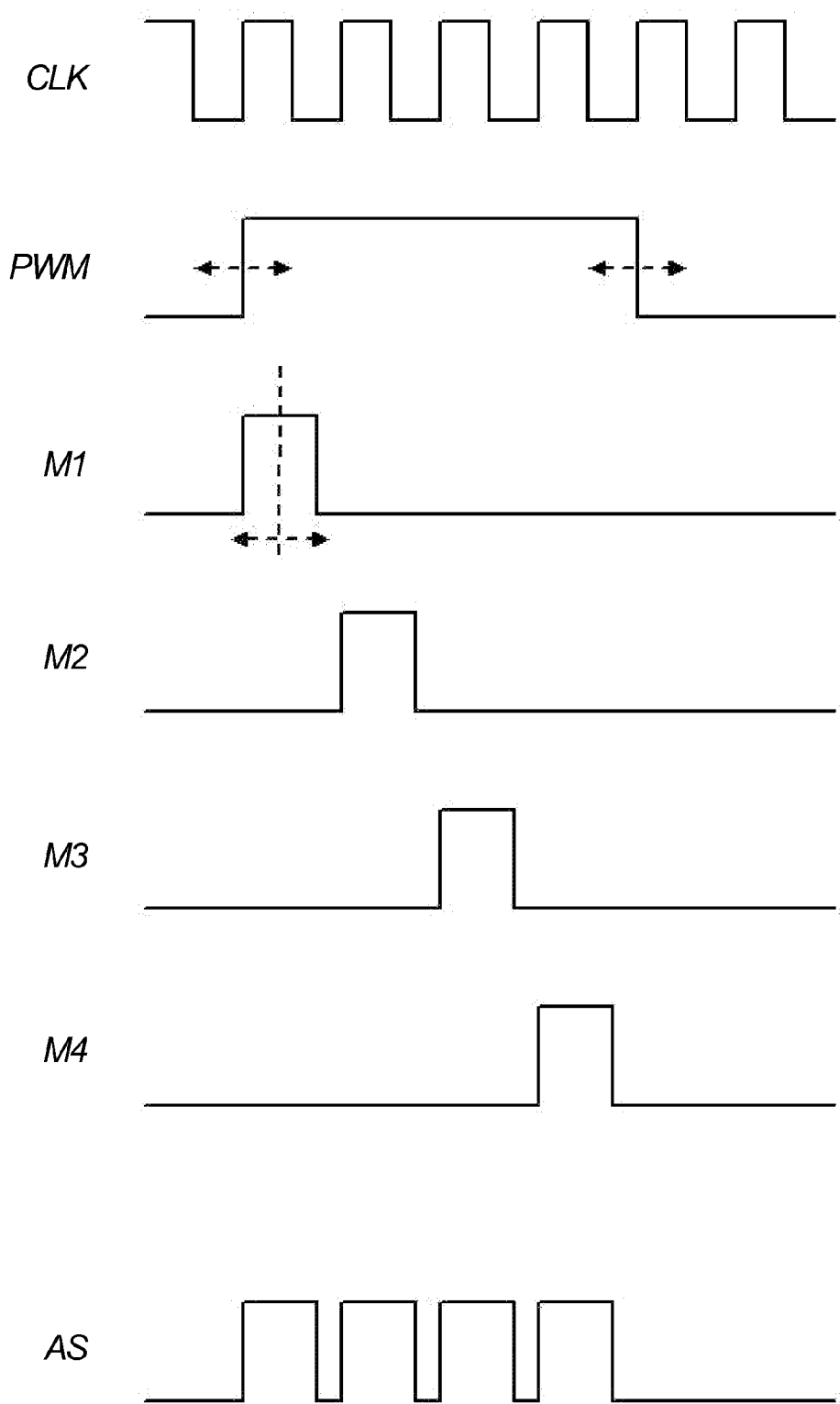

FIG. 28 illustrates signal examples according to a further embodiment of reducing the jitter consequence according to the present invention. The first signal is a clock CLK used for the D/A-conversion, and any jitter in this clock will therefore lead to consequential errors in the resulting analog signal. The second signal is a time-quantized PWM signal, i.e. a digital signal DS. By simple conversion to analog by a 1-bit DAC, e.g. a latch as in FIG. 3, the jitter error will cause the position of the leading and trailing PWM edges to vary, as indicated by the arrows. This variation also causes the area in the PWM pulse to vary, and the area in the pulse is exactly what represents the values in a PWM signal. Therefore the area variation will cause noise in the converted utility signal converted. In the embodiment of FIG. 28, the PWM signal PWM is instead transformed into a "sum-of-bits"-analog signal by a monostable multivibrator. The monostable multivibrator is trigged by the clock CLK and the PWM-signal PWM so that is outputs pulses M1, M2, M3, M4 whenever both are high. By using a clock faster than the PWM switch frequency, the monostable multivibrator will establish a number of pulses for each PWM pulse, the number depending on the width of the PWM pulse. The width of the output pulses are not defined by the clock, but for example by a resistor-capacitor circuit, RC circuit. Thereby the jitter errors from the clock only affect the position of each output pulse, not their widths, and thereby not their areas, as indicated by the arrows in M1. The last signal is the resulting analog signal AS. It comprises a number of equal-widths pulses together having an area comparable to the area of the PWM pulse minus the gaps between the pulses. However, these gaps only represent a gain error. The jitter error only influences the positioning of the pulses, and therefore the resulting signal in practice only comprises a timing error being the average of the positioning errors of the first and last pulses. Compared to a simple one-bit DAC conversion leading to timing errors of the leading and trailing edge, as well as an area error as they are not equal because they are uncorrelated, the embodiment of FIG. 28 leads to correct area except from a gain error, and a timing error.

Figure 29:
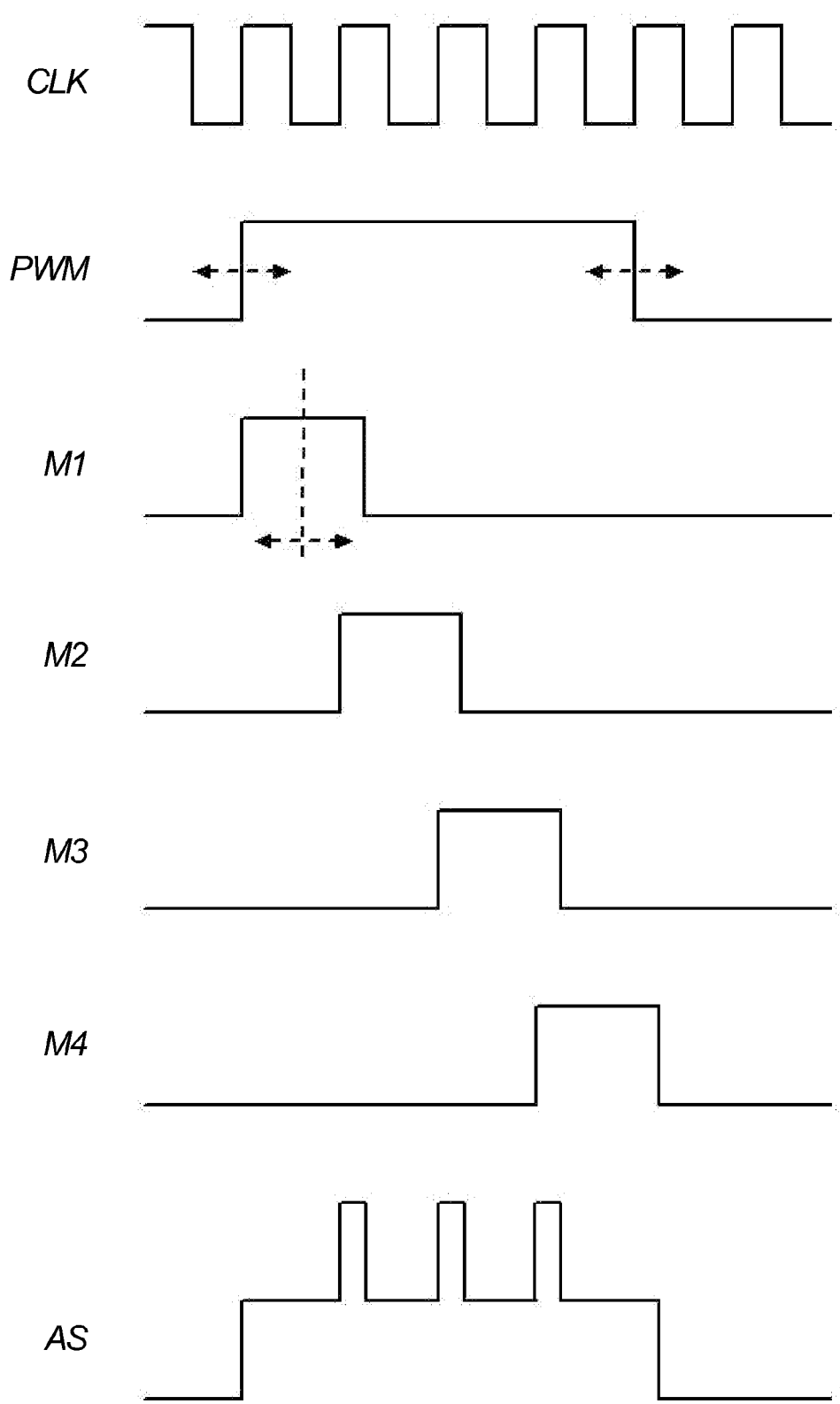

FIG. 29 illustrates signals related to a variant of the embodiment of FIG. 28. In this embodiment the width of the pulses established by the monostable multivibrator are greater than one clock cycle. This means that one monostable multivibrator cannot establish subsequent pulses, and more than one monostable multivibrator is therefore needed. On the other hand, the resulting pulses will overlap each other instead of causing gaps. The overlaps simply cause a gain error as the gaps. As the pulses established by multiple monostable multivibrators do not comprise the exact same widths, e.g. due to inaccurate RC-circuits, this may cause distortion. This distortion may be reduced by dynamic element matching where the sequence of bits from different monostable multivibrators is randomized.

In the embodiments described above with reference to FIGS. 28 and 29, the reduction of high frequency content comprises the reduction from the digital signal being susceptible to jitter errors affecting both timing and area in the one-bit DAC example to the digital signal being susceptible to jitter errors affecting only timing in the "sum-of-bits"-examples.

Figures 30, 31:
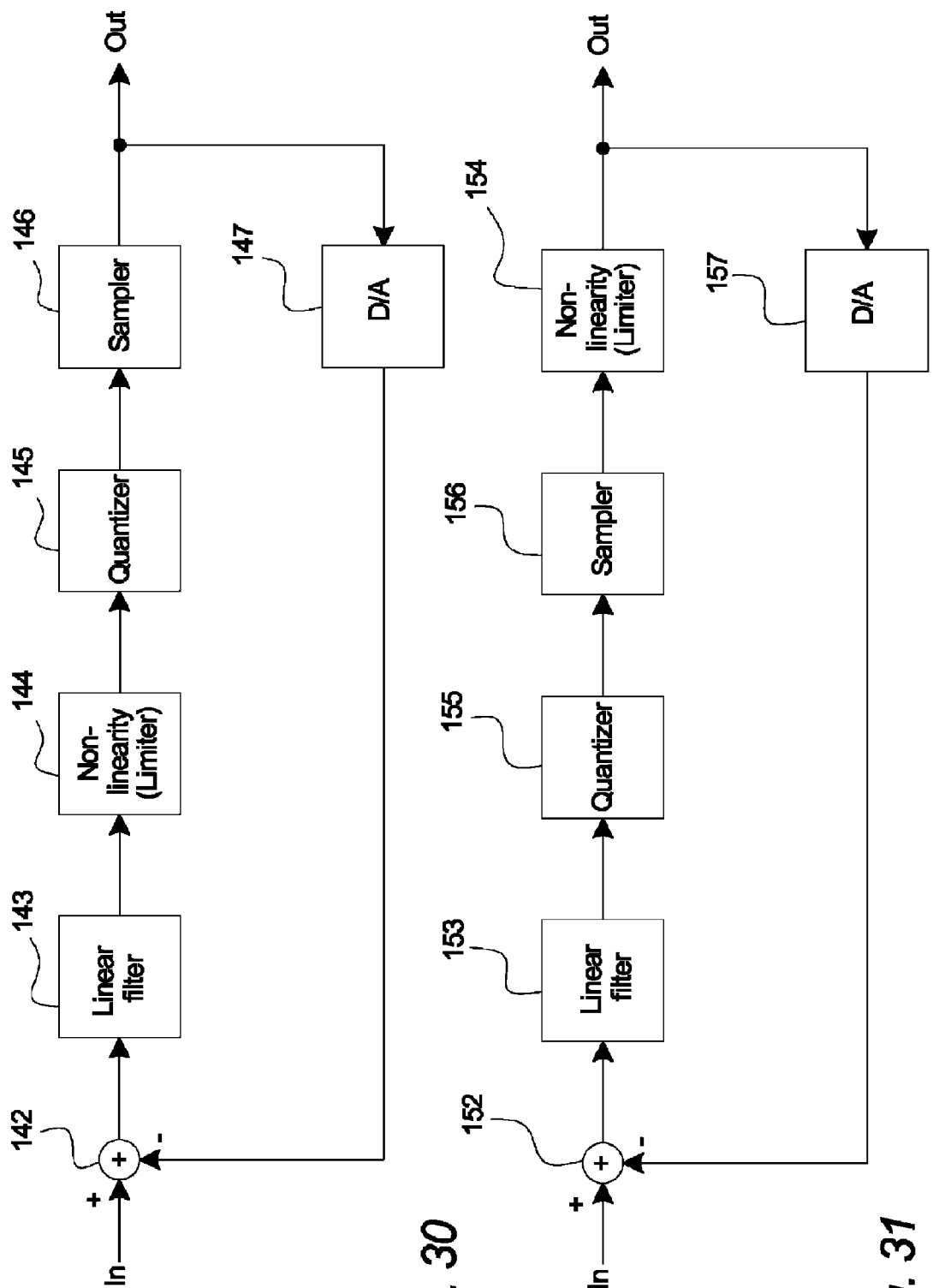

FIG. 30 illustrates the principles of a modulator, i.e. a pulse modulating A/D-converter, where the time quantizer is included in the loop. The modulator may preferably be a self-oscillating modulator.

The illustrated embodiment of the invention comprises the following principal functional steps starting with an input feeding a summing point 142, elsewhere referred to a subtraction point. The output of the summing point is fed to a non-linearity,—a limiter 144 via a linear filter 143. The limiter outputs the limited, i.e. modulated, signal to a quantizer 145. The quantizer 145 quantizes the modulated signal in the amplitude domain and feeds a sampler 146 adapted for time quantizing of the signals received from quantizer 145. The time-discrete output of the sampler 146 is fed to the output of the arrangement and moreover fed back to the summing point 142 via a D/A converter 147. The D/A converter is adapted for converting the time-discrete signal into an analogue representation compatible with the input signal. The D/A-converter is according to the present invention preferably of a jitter consequence reducing D/A-converter type as described above.

It is noted that the above-described embodiment in principle may be applied in a single or multi-bit application. In a single bit implementation, the limiter 144 and the quantizer 145 would typically comprise one single comparator providing both the desired non-linearity and the desired, i.e. two levels, quantizing level. In such an embodiment, the D/A converter in the feedback path of the oscillator may be omitted as the desired analogue signal for the feedback path is in principle provided by the hold-circuit of the latch and may be branched back to the summing point as an analogue signal, whereas a digital signal is output for further processing.

FIG. 31 illustrates an embodiment of the invention where the non-linearity is arranged in the digital domain.

The illustrated embodiment of the invention comprises the following principal functional steps starting with an input IN feeding a summing point 152. The output of the summing point is led to a quantizer 155 via a linear filter 153. The quantizer 155 quantizes the filtered signal and feeds a sampler 156 adapted for time quantizing of the signals received from quantizer 155. The time-quantized signal is then fed to a non-linearity 154, i.e. a limiter. The limiter outputs the limited, i.e. modulated, signal to the output of the circuit and moreover feeds a signal back to the summing point 152 via a D/A converter 157. The D/A converter is adapted for converting the time-discrete signal into an analogue representation compatible with the input signal. The D/A-converter is according to the present invention preferably of a jitter consequence reducing D/A-converter type as described above.

Basically, this topology involves the same process steps as the above described, now with the difference that the limiter 154 is included in the digital domain. In other words, the non-linearity is now defining the desired modulation subsequent to the time quantizing of the signal.

Figure 32:
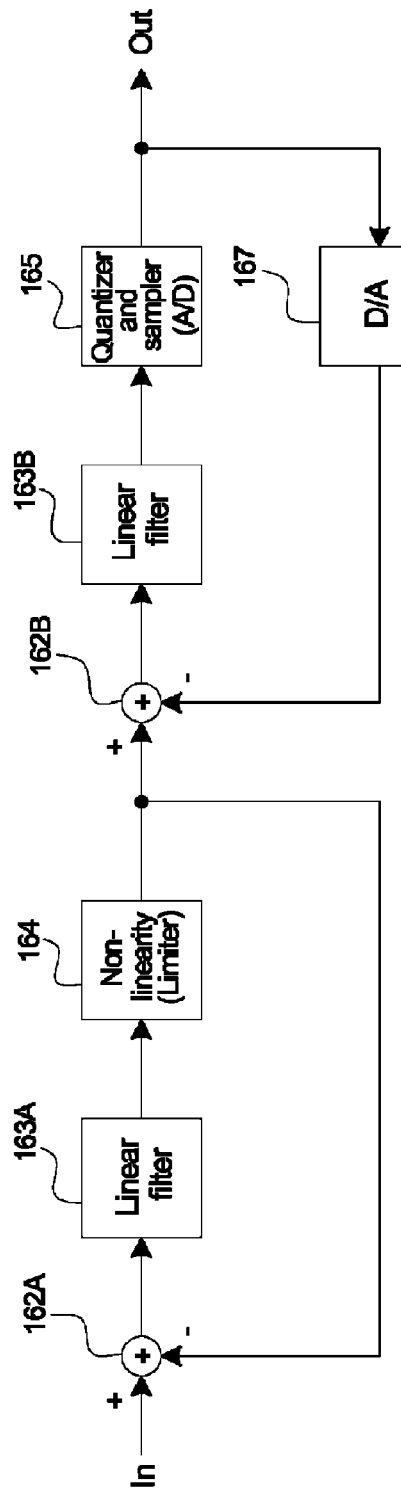

FIG. 32 illustrates an embodiment of the invention where the non-linearity is included in an amplitude quantizing self-oscillating loop and cascaded with a subsequent time quantizer comprising a noise shaper.

The illustrated embodiment of the invention comprises the following principal functional steps starting with an input IN feeding a summing point 162A. The output of the summing point 162A is led to a limiter 164 via a linear filter 163A. The analogue output, a PWM signal, of the limiter 164 is moreover fed directly back to the summing point 162A. This first stage of the circuit forms a self-oscillating modulator.

Moreover, the output of the limiter is fed to a quantizer/sampler 165 via a summing point 162B and a linear filter 163B. The time-discrete output of the quantizer/sampler 165 is fed to the output Out of the circuit and is moreover fed back to the summing point 162B via a D/A converter 167. The D/A converter 167 is adapted for converting the time-discrete signal into an analogue representation compatible with the signal received on the input of the summing point 162B from the limiter 164. The D/A-converter is according to the present invention preferably of a jitter consequence reducing D/A-converter type as described above.

Basically, this embodiment differs from the above-described embodiments of FIGS. 30 and 31 in the sense that the initial amplitude quantizing and the subsequent time quantizing have now been separated. Hence, the amplitude quantizing is included in the self-oscillating loop 162A, 163A and 164 while the subsequent time quantizing is handled with respect to time-quantizing error in a more conventional way by means of noise shaping.

The benefit of this embodiment is basically, that the filter 163B may be optimized for noise-shaping purposes.

Figure 33:
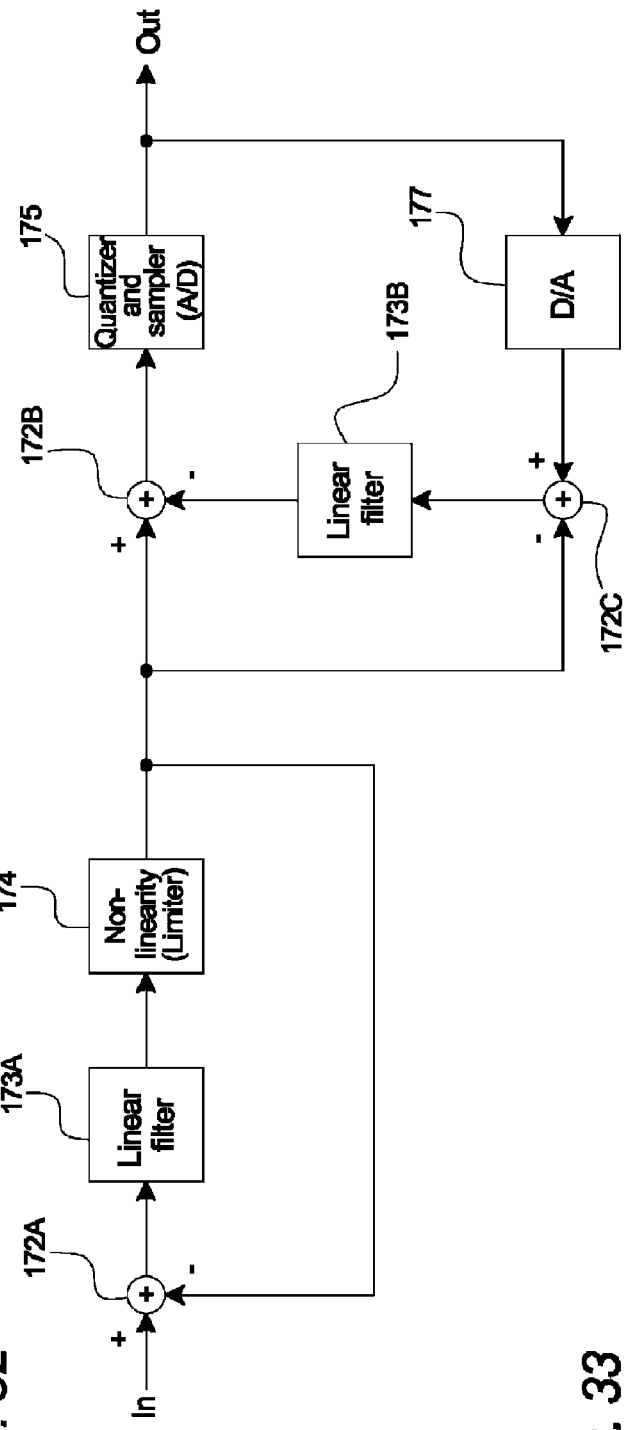

FIG. 33 illustrates an embodiment of the invention corresponding to FIG. 32 but where only the quantizing error resulting from the time quantizer is filtered in the time-quantizing stage.

The illustrated embodiment of the invention comprises the following principal functional steps starting with an input IN feeding a summing point 172A. The output of the summing point 172A is led to a limiter 174 via a linear filter 173A. The analogue output, a PWM signal, of the limiter 174 is moreover fed directly back to the summing point 172A. This first stage of the circuit forms a self-oscillating modulator.

Moreover, the output of the limiter is fed a quantizer/sampler 175 via a second summing point 172B. The time-discrete output of the quantizer/sampler 175 is fed to the output Out of the circuit and is moreover fed back to a third summing point 172C via a D/A converter 177. The D/A converter 177 is adapted for converting the time-discrete signal into an analogue representation compatible with the signal received on the input of the summing point 172C from the limiter 174. The D/A-converter is according to the present invention preferably of a jitter consequence reducing D/A-converter type as described above. Moreover, a linear filter 173B is inserted between the output of the summing point 172C and a further input of the summing point 172B.

It is noted that the noise shaper in the second modulator stage, i.e. the time-quantizing stage, is slightly different from that of FIG. 32, thereby offering another variation of a time noise-shaping characteristic. This variation may, as noted above, be established independent of stage 1, i.e. the amplitude quantizer.

Moreover, it should be noted that stage one of both the above-described embodiments establishes the desired self-oscillation modulation technique, whereas stage two, which is typically not-self-oscillating deals with the time quantizer noise separately within influencing the operation of stage one in other ways than the simple additive function.

Figure 34:
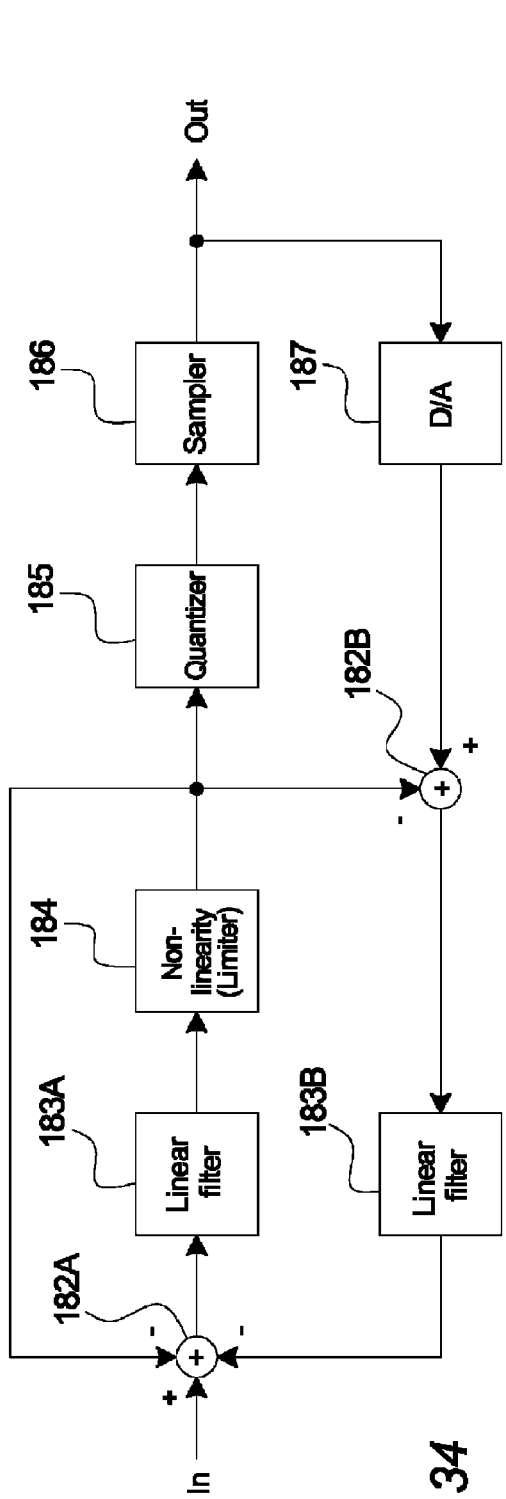

FIG. 34 illustrates a further embodiment of the invention where the time-quantizing error is fed back to the amplitude self-oscillating loop.

The illustrated embodiment of the invention comprises the following principal functional steps starting with an input feeding a summing point 182A. The output of the summing point is fed to a limiter 184 via a linear filter 183A. The limiter outputs the limited, i.e. modulated, signal to a quantizer 185. The quantizer 185 quantizes the modulated signal in the amplitude domain and feeds a sampler 186 adapted for time quantizing of the signals received from quantizer 185. The time-discrete output of the sampler 186 is fed to the output of the arrangement and moreover fed back to a second summing point 182B via a D/A converter 187. The D/A converter is adapted for converting the time-discrete signal into an analogue representation compatible with the input signal of the summing point 182B received from the output of the limiter 184. The D/A-converter is according to the present invention preferably of a jitter consequence reducing D/A-converter type as described above. The output of the summing point 182B is moreover fed back to the summing point 182A via a second linear filter 183A.

A further feedback is established from the output of the limiter 184 to the summing point 182A basically forming a self-oscillating/modulating loop, whereas the other loop, the below loop, forms a quantizing error correcting feedback loop according to conventional feedback principles, i.e. substantially non-oscillating.

Basically, the above loop, i.e. the loop comprising the linear filter 183A, the limiter 184 and the feedback to the summing point 182A typically forms the desired self-oscillating modulator, whereas the quantizer 185 and the sampler 186 in a more simple way form a circuit by means of the "below" feedback "line" 187, 183B connected to the summing points 182B and 182A facilitate a more conventional feedback of the time quantizing noise. It is noted that the time-quantizing noise of the combined quantizer 185 and sampler 186 may in fact be fed back effectively to the summing 182A, thereby availing a certain degree of time-quantizing noise suppression by means of the self-oscillating stage one.

Figure 35:
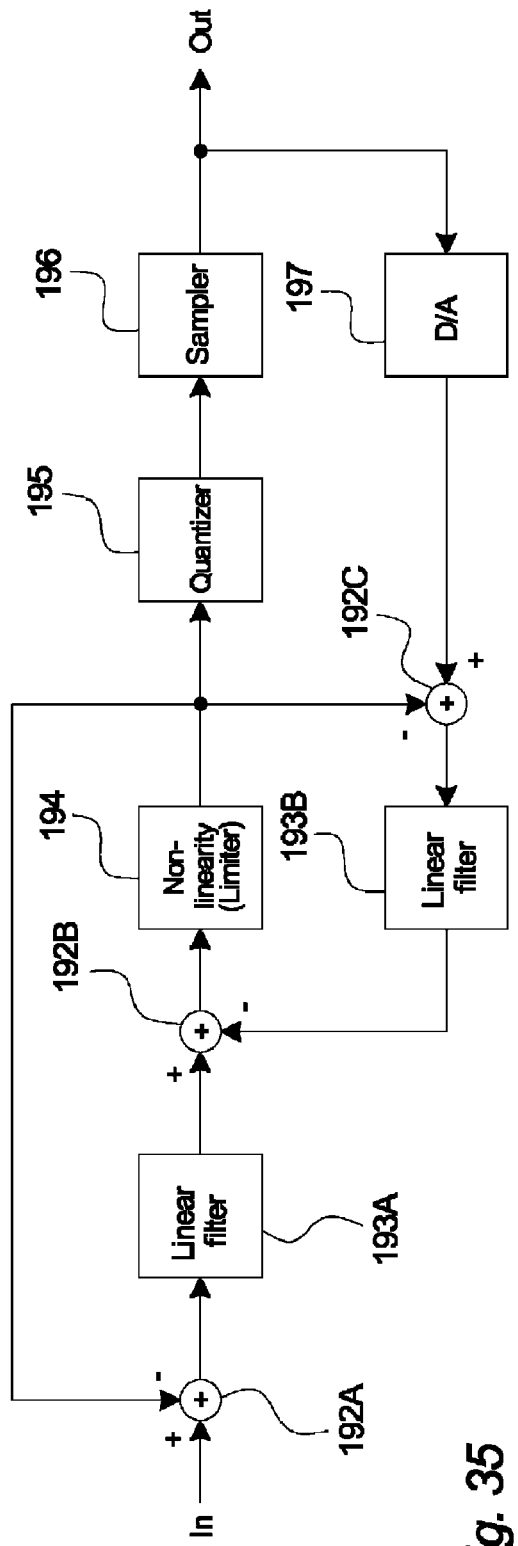

FIG. 35 illustrates a further topology of feeding the time-quantizing error back to the amplitude self-oscillating loop.

The illustrated embodiment of the invention comprises the following principal functional steps starting with an input feeding a summing point 192A. The output of the summing point is fed to a limiter 194 via a linear filter 193A and a second summing point 192B. The limiter outputs the limited, i.e. modulated, signal to a quantizer 195. The quantizer 195 quantizes the modulated signal in the amplitude domain and feeds a sampler 196 adapted for time quantizing of the signals received from quantizer 195. The time-discrete output of the sampler 196 is fed to the output of the arrangement and moreover fed back to a third summing point 192C via a D/A converter 197. The D/A converter is adapted for converting the time-discrete signal into an analogue representation compatible with the input signal of the summing point 192C received from the output of the limiter 194. The D/A-converter is according to the present invention preferably of a jitter consequence reducing D/A-converter type as described above. The output of the third summing point 192C is moreover fed back to the second summing point 192B via a second linear filter 193B.

A further feedback is established from the output of the limiter 194 to the summing point 192A basically forming a self-oscillating/modulating loop, whereas the other loop, the below, forms a quantizing error-correcting feedback loop according to conventional feedback principles, i.e. substantially non-oscillating.

Basically, the above loop benefits from a separate handling of the time-quantizing signal from the sampler 196 and the input due to the different filters 193A and 193B.

In the above described embodiments, any of the self-oscillating loops may be substituted with non-self-oscillating loops.

In addition to all of the above, the present invention also comprises broader aspects, using the same principles to achieve advantages in other contexts, or to further improve the above-described embodiments.

For example, the jitter consequence reducing D/A-converter may be used with the same of similar advantages in other digital to analog conversion tasks, in particular where a bitstream, e.g. PWM, is converted to an analog representation.

In broad terms, the jitter consequence reducing D/A-converter works by conditioning the signal into a signal which jitter errors affect less, without removing utility information. Such conditioning typically comprises a kind of low-pass filtering or high frequency component reduction.

In other words, the consequence of the jitter in the resulting analog signal is a combination of the amount of jitter in the clock or errors in other conversion means and how much the signal is affected by jitter or errors. Thus the jitter consequence can be reduced by either decreasing the jitter or increasing the signal's robustness to jitter.

Several of the jitter consequence reducing D/A-converter embodiments according to the present invention can also be described as establishing the full analog signal as the sum of several partly D/A-conversions, where the term partly relates to the amplitude. I.e. instead of converting one or a few steps, the signal is transformed into a multi-level signal, and each step is converted separately or at least with jitter or other errors uncorrelated with the other conversions. The effect of such embodiments depend on the number of conversions: The more uncorrelated jitter error contributions that are used for converting one edge of the digital input signal, the less consequence is applied in the resulting analog signal.

The invention claimed is:

1. An A/D converter comprising
an input,
an output,
a D/A converting feedback and
a pulse width modulating forward path;
the D/A converting feedback comprising at least one feedback path;
the feed-back path establishing a D/A conversion based on at least two D/A conversions subject to uncorrelated errors, wherein the uncorrelated errors are derived from substantially Gaussian jitter in a clock signal.

2. The A/D converter according to claim 1, wherein said errors are jitter errors.

3. The A/D converter according to claim 1, wherein said errors are derived from one or more error sources.

4. The A/D converter according to claim 1, wherein the at least two D/A conversions are summed.

5. The A/D converter according to claim 1, wherein the uncorrelated errors are established on a basis of one or more error sources.

6. The A/D converter according to claim 1, wherein the D/A converting feedback comprises a multiple of serially-coupled latches.

7. The A/D converter according to claim 1, wherein the uncorrelated errors are established on a basis of a number of parallel error sources.

8. The A/D converter according to claim 1, wherein the D/A converting feedback comprises a multiple of latches coupled in parallel.

9. The A/D converter according to claim 1, wherein the D/A converting feedback comprises a multi-level D/A-converter.

10. The A/D converter according to claim 9, wherein the multi-level D/A converter comprises a binary weighed multi-level D/A-converter.

11. The A/D converter according to claim 1, wherein the uncorrelated errors are established on a basis of one or more error sources by means of multiple outputs from a delay line.

12. The A/D converter according to claim 1, wherein the D/A converting feedback comprises at least one monostable multivibrator or equivalent which converts a digital bitstream into an analog sum-of-bits.

13. The A/D converter according to claim 1, wherein said D/A converting feedback path comprises oversampling means.

14. The A/D converter according to claim 1, wherein said A/D-converter comprises a downsampler or decimator.

15. The A/D converter according to claim 1, wherein said pulse width modulating forward path is self-oscillating.

16. The A/D converter according to claim 1, wherein said A/D converter establishes a 3-level PWM signal.

17. The A/D converter according to claim 1, wherein said A/D converter comprises a multi channel A/D converter.

18. A jitter consequence reducing D/A-converter comprising a jitter-robust intermediate signal established on a basis of a digital input signal, wherein the jitter-robust intermediate signal comprises a number of effective signal levels greater than a number of effective signal levels in the digital input signal.

19. The jitter consequence reducing D/A-converter according to claim 18, comprising a filter and a multi-level D/A-converter.

20. The jitter consequence reducing D/A-converter according to claim 19, wherein the multi-level D/A-converter comprises a binary-weighed multi-level D/A-converter.

21. The jitter consequence reducing D/A-converter according to claim 19, wherein conversions for each level in the multi-level D/A-converter are subject to errors, and the errors for each level are uncorrelated and derived from one or more error sources.

22. The jitter consequence reducing D/A-converter according to claim 21, wherein the errors are jitter errors.

23. The jitter consequence reducing D/A-converter according to claim 18, wherein establishment of said jitter-robust intermediate signal comprises reducing, filtering, shaping or conditioning high frequency content of the digital input signal.

24. The jitter consequence reducing D/A-converter according to claim 18, wherein the jitter consequence reducing D/A-converter comprises a filter; the filter comprising a high-frequency reducing, filtering, shaping or conditioning filter.

25. The jitter consequence reducing D/A-converter according to claim 18, comprising a multi-channel D/A-converter.

26. The jitter consequence reducing D/A-converter according to claim 18, comprising multiple jitter-robust, intermediate signals, filters and multi-level D/A-converters, together forming a multi-level jitter consequence reducing D/A-converter.

27. The jitter consequence reducing D/A-converter according to claim 18, comprising at least one monostable multivibrator or equivalent adapted to convert a digital bitstream into an analog sum-of-bits-signal.

28. A pulse width modulated A/D-converter comprising feedback, wherein the feedback comprises a jitter consequence reducing D/A-converter comprising a jitter-robust intermediate signal established on a basis of a digital input signal, wherein the jitter-robust intermediate signal comprises a number of effective signal levels greater than a number of effective signal levels in the digital input signal.

29. The pulse width modulated A/D-converter according to claim 28, wherein said pulse width modulated A/D-converter comprises an input, an output, a D/A converting feedback and a pulse width modulating forward path; the D/A converting feedback comprising at least one feed-back path; the feedback path establishing a D/A conversion based on at least two D/A conversions subject to uncorrelated errors.

30. A method for jitter consequence reduction in a feedback of a pulse width modulated A/D-converter, comprising establishing at least two D/A-conversions subject to uncorrelated errors, and combining said at least two D/A-conversions.

31. The method for jitter consequence reduction according to claim 30, wherein said combining said at least two D/A-conversions is performed by summing.

* * * * *